United States Patent
Smiley

(10) Patent No.: US 10,698,031 B2
(45) Date of Patent: Jun. 30, 2020

(54) SYSTEMS AND METHODS FOR OBTAINING AND VALIDATING PERFORMANCE DATA ON MOTORS

(71) Applicant: R. Gene Smiley, West Chester, OH (US)

(72) Inventor: R. Gene Smiley, West Chester, OH (US)

(*) Notice: Subject to any disclaimer, the term of this patent is extended or adjusted under 35 U.S.C. 154(b) by 21 days.

(21) Appl. No.: 16/265,362

(22) Filed: Feb. 1, 2019

(65) Prior Publication Data

US 2019/0242947 A1    Aug. 8, 2019

Related U.S. Application Data

(60) Provisional application No. 62/625,642, filed on Feb. 2, 2018.

(51) Int. Cl.
| | |
|---|---|
| G01R 31/02 | (2006.01) |
| H02H 3/04 | (2006.01) |
| H02H 7/08 | (2006.01) |
| H02K 11/00 | (2016.01) |
| G01R 31/34 | (2020.01) |
| H02P 23/14 | (2006.01) |
| H02P 23/20 | (2016.01) |

(52) U.S. Cl.
CPC ............ *G01R 31/343* (2013.01); *H02P 23/14* (2013.01); *H02P 23/20* (2016.02)

(58) Field of Classification Search
CPC .............................. G01R 31/343; H02P 23/20
USPC ........................................................ 318/490
See application file for complete search history.

(56) References Cited

U.S. PATENT DOCUMENTS

| | | |
|---|---|---|
| 4,891,764 A | 1/1990 | McIntosh |
| 5,476,158 A | 12/1995 | Mann et al. |
| 5,519,300 A | 5/1996 | Leon et al. |
| 5,521,482 A * | 5/1996 | Lang .................... G01R 31/343 |
| | | 318/800 |
| 5,659,232 A | 8/1997 | Benning |
| 5,739,698 A | 4/1998 | Bowers et al. |
| 5,861,728 A | 1/1999 | Tazawa et al. |
| 6,236,947 B1 | 5/2001 | Dowling et al. |
| 6,727,725 B2 | 4/2004 | Devaney et al. |
| 6,774,664 B2 | 8/2004 | Godbersen |
| 6,862,538 B2 | 3/2005 | El-Ibiary |
| 7,075,327 B2 | 7/2006 | Dimino et al. |
| 7,135,830 B2 | 11/2006 | El-Ibiary |
| 7,184,902 B2 | 2/2007 | El-Ibiary |
| 7,769,552 B2 | 8/2010 | Colby et al. |
| 7,956,637 B2 | 6/2011 | Lu et al. |
| 8,253,365 B2 | 8/2012 | Yeh |
| 8,332,071 B2 | 12/2012 | Zeltzer |

(Continued)

FOREIGN PATENT DOCUMENTS

| | | |
|---|---|---|
| CN | 1480740 A | 3/2004 |
| CN | 101363901 A | 2/2009 |

(Continued)

OTHER PUBLICATIONS

Finley, William R. et al.; Understanding Complete Tests Performed on Induction Motors; NETA World; Summer 2004; 5 pages.

*Primary Examiner* — Erick D Glass
(74) *Attorney, Agent, or Firm* — Ulmer & Berne LLP

(57) ABSTRACT

A method for conducting testing of an electric motor to obtain performance curves, including locked rotor data, is provided.

20 Claims, 9 Drawing Sheets

(56) References Cited

U.S. PATENT DOCUMENTS

| | | | |
|---|---|---|---|
| 8,405,339 B2* | 3/2013 | Zhang | G01R 31/343 |
| | | | 318/490 |
| 8,473,228 B2 | 6/2013 | Tiwari et al. | |
| 8,497,698 B2 | 7/2013 | Yeh | |
| 9,024,569 B2 | 5/2015 | Wang et al. | |
| 9,050,894 B2 | 6/2015 | Banerjee et al. | |
| 9,261,562 B2 | 2/2016 | Lee et al. | |
| 9,759,774 B2 | 9/2017 | Kato et al. | |
| 9,977,084 B2 | 5/2018 | Ramdane | |
| 2008/0100146 A1* | 5/2008 | Washington | H01H 1/0015 |
| | | | 307/130 |
| 2010/0060289 A1 | 3/2010 | Wiedenbrug et al. | |
| 2010/0169030 A1 | 7/2010 | Parlos | |
| 2013/0338939 A1* | 12/2013 | Nandi | G01R 31/346 |
| | | | 702/38 |
| 2015/0260794 A1 | 9/2015 | Athikessavan et al. | |
| 2015/0293177 A1 | 10/2015 | Ottewill et al. | |
| 2017/0257041 A1 | 9/2017 | Lee et al. | |

FOREIGN PATENT DOCUMENTS

| | | |
|---|---|---|
| CN | 102707233 A | 10/2012 |
| CN | 103344368 A | 10/2013 |
| CN | 104215906 A | 12/2014 |
| CN | 104656017 A | 5/2015 |
| JP | 2005341678 A | 12/2005 |
| JP | 2010288352 A | 12/2010 |

\* cited by examiner

SYSTEMS AND METHODS FOR OBTAINING AND VALIDATING PERFORMANCE DATA ON MOTORS

REFERENCE TO RELATED APPLICATION

This application claims priority of U.S. provisional patent application Ser. No. 62/625,642, entitled Systems and Methods for Obtaining and Validating Performance Data on Motors, filed Feb. 2, 2018, and hereby incorporates this provisional patent application by reference herein in its entirety.

TECHNICAL FIELD

A method of performing no load testing of an electric motor is provided. In particular, the method relates, in general, to obtaining and validating performance data on induction, brushed DC, permanent magnet DC (PMDC) and industrial direct current motors from recorded test data without a dynamometer.

BACKGROUND

There are many scenarios where a quick, accurate validation of motor performance is valuable such as during design, vendor qualification, production, integration, commissioning, troubleshooting, post-repair, and more. Conventional methods for generating performance curves may involve connection of the test motor to a loading device (a dynamometer), which can require not only an alignment procedure but also significant infrastructure and resources to install, operate and maintain the loading system, which can be time consuming. When the test motor is tested under these conditions, unwanted heat can be generated within the windings, which can cause damage to the motor. When performing multiple tests in succession, the test motor must be allowed to cool down for long periods of time between tests to reduce the risk of damage, which can make the testing time consuming and cumbersome.

BRIEF DESCRIPTION OF THE DRAWINGS

It is believed that certain embodiments will be better understood from the following description taken in conjunction with the accompanying drawings in which.

DETAILED DESCRIPTION

Figure 1:
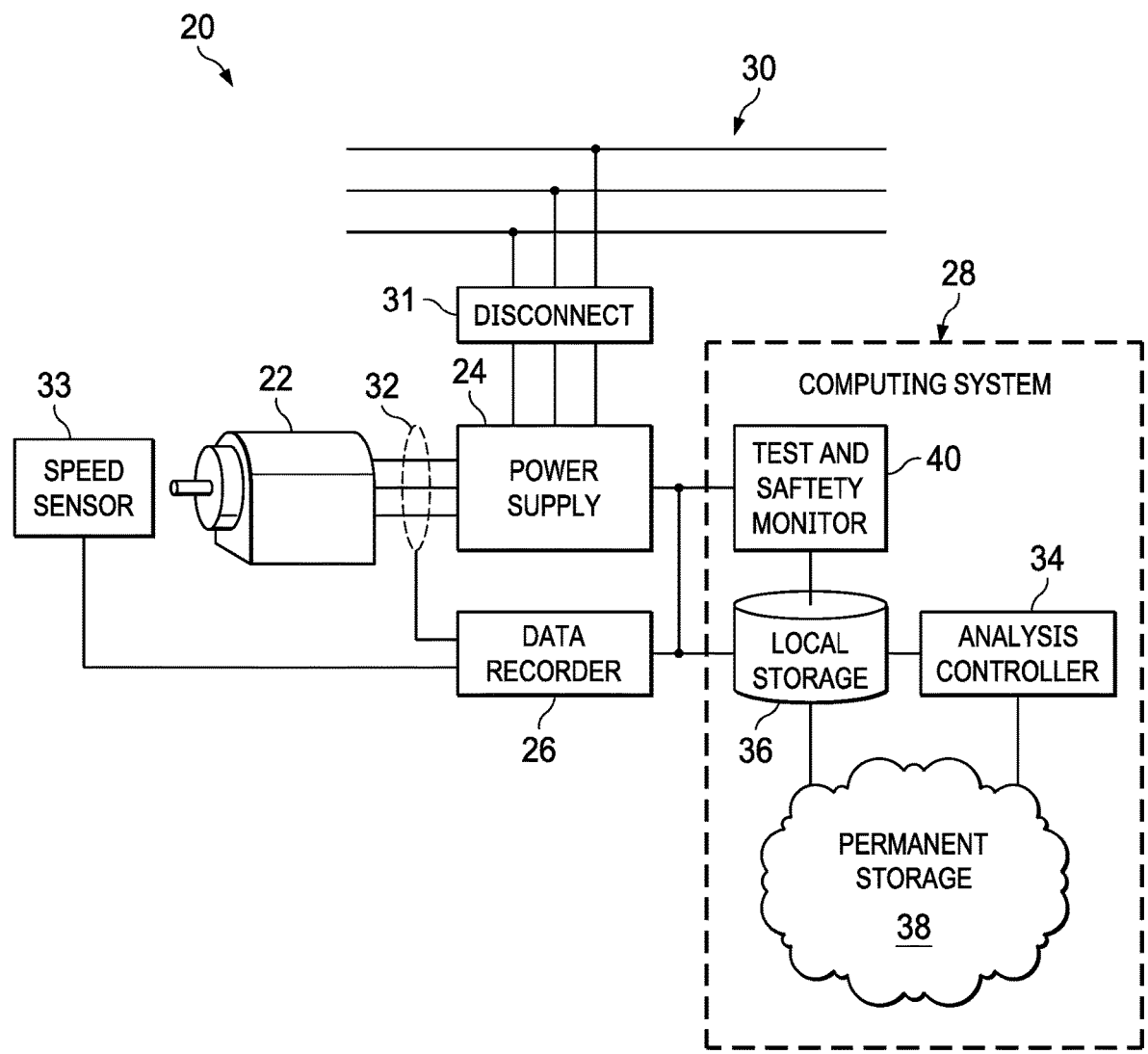
FIG. 1 is a schematic view depicting a testing system and an electric motor.

Various non-limiting embodiments of the present disclosure will now be described to provide an overall understanding of the principles of the structure, function, and use of the apparatuses, systems, methods, and processes disclosed herein. One or more examples of these non-limiting embodiments are illustrated in the accompanying drawings. Those of ordinary skill in the art will understand that systems and methods specifically described herein and illustrated in the accompanying drawings are non-limiting embodiments. The features illustrated or described in connection with one non-limiting embodiment may be combined with the features of other non-limiting embodiments. Such modifications and variations are intended to be included within the scope of the present disclosure.

Reference throughout the specification to "various embodiments," "some embodiments," "one embodiment," "some example embodiments," "one example embodiment," or "an embodiment" means that a particular feature, structure, or characteristic described in connection with any embodiment is included in at least one embodiment. Thus, appearances of the phrases "in various embodiments," "in some embodiments," "in one embodiment," "some example embodiments," "one example embodiment," or "in an embodiment" in places throughout the specification are not necessarily all referring to the same embodiment. Furthermore, the particular features, structures or characteristics may be combined in any suitable manner in one or more embodiments. In various embodiments disclosed herein, a single component can be replaced by multiple components and multiple components can be replaced by a single component to perform a given function or functions. Except where such substitution would not be operative, such substitution is within the intended scope of the embodiments.

Described herein are example embodiments of apparatuses, systems, and methods for obtaining and validating performance data on an electric motor such as an induction motor, a brushed DC motor, permanent magnet DC (PMDC) motor, and industrial direct current motors, for example, from recorded test data without requiring a dynamometer.

The examples discussed herein are examples only and are provided to assist in the explanation of the apparatuses, devices, systems and methods described herein. None of the features or components shown in the drawings or discussed below should be taken as mandatory for any specific implementation of any of these the apparatuses, devices, systems or methods unless specifically designated as mandatory. For ease of reading and clarity, certain components, modules, or methods may be described solely in connection with a specific figure. Any failure to specifically describe a combination or sub-combination of components should not be understood as an indication that any combination or sub-combination is not possible. Also, for any methods described, regardless of whether the method is described in conjunction with a flow diagram, it should be understood that unless otherwise specified or required by context, any explicit or implicit ordering of steps performed in the execution of a method does not imply that those steps must be performed in the order presented but instead may be performed in a different order or in parallel.

Described are systems and methods for obtaining the performance curves of any type of motor through a startup against its own inertia as the load. We introduce a comprehensive procedure including several new metrics for data quality assessment, cross-validation, and proof of adherence to physics, which provide sufficient additional credibility and utility as to make the method commercially viable for general use.

In general, it will be apparent to one of ordinary skill in the art that at least some of the embodiments described herein can be implemented in many different embodiments of software, firmware, and/or hardware. The software and firmware code can be executed by a processor or any other similar computing device. The software code or specialized control hardware that can be used to implement embodiments, is not limiting. For example, embodiments described herein can be implemented in computer software using any suitable computer software language type, using, for example, conventional or object-oriented techniques. Such software can be stored on any type of suitable computer-readable medium or media, such as, for example, a magnetic or optical storage medium. The operation and behavior of the embodiments can be described without specific reference to specific software code or specialized hardware components. The absence of such specific references is feasible, because it is clearly understood that artisans of ordinary skill would be able to design software and control hardware to implement the embodiments based on the present description with no more than reasonable effort and without undue experimentation.

Moreover, the processes described herein can be executed by programmable equipment, such as computers or computer systems and/or processors. Software that can cause programmable equipment to execute processes can be stored in any storage device, such as, for example, a computer system (nonvolatile) memory, an optical disk, magnetic tape, or magnetic disk. Furthermore, at least some of the processes can be programmed when the computer system is manufactured or stored on various types of computer-readable media.

It can also be appreciated that certain portions of the processes described herein can be performed using instructions stored on a computer-readable medium or media that direct a computer system to perform the process steps. A computer-readable medium can include, for example, memory devices such as diskettes, compact discs (CDs), digital versatile discs (DVDs), optical disk drives, or hard disk drives. A computer-readable medium can also include memory storage that is physical, virtual, permanent, temporary, semi-permanent, and/or semi-temporary.

A "computer," "computer system," "host," "server," or "processor" can be, for example and without limitation, a processor, microcomputer, minicomputer, server, mainframe, laptop, personal data assistant (PDA), wireless e-mail device, cellular phone, pager, processor, fax machine, scanner, or any other programmable device configured to transmit and/or receive data over a network. Computer systems and computer-based devices disclosed herein can include memory for storing certain software modules used in obtaining, processing, and communicating information. It can be appreciated that such memory can be internal or external with respect to operation of the disclosed embodiments. The memory can also include any means for storing software, including a hard disk, an optical disk, floppy disk, ROM (read only memory), RAM (random access memory), PROM (programmable ROM), EEPROM (electrically erasable PROM) and/or other computer-readable media. Non-transitory computer-readable media, as used herein, comprises all computer-readable media except for a transitory, propagating signals.

A computer system in accordance with the present disclosure can be accessed via any suitable technique, such as a web-browser such as SAFARI, OPERA, GOOGLE CHROME, INTERNET EXPLORER, or the like executing on a client device. In some embodiments, the systems and methods described herein can be a web-based application or a stand-alone executable. Additionally, in some embodiments, the systems and methods described herein can integrate with various types of computer systems, such as monitoring and control systems, and the like. Any suitable client device can be used to access, or execute, the computing system, such as laptop computers, desktop computers, smart phones, tablet computers, gaming system, and the like. Systems and methods described herein may generally provide a real time or near real-time monitoring environment. Interaction with the system may include, without limitation, keyboard entry, writing from pen, stylus, finger, or the like, with a computer mouse, or other forms of input (voice recognition, etc.). A dashboard or other metrics may be presented on a tablet, desktop, or the like.

In connection with the views and examples of FIGS. 1-17, wherein like numbers indicate the same or corresponding elements throughout the views, FIG. 1 illustrates one embodiment of a testing system 20 that can be utilized to facilitate testing of an electric motor 22 as described further herein. One example of the electric motor 22 used for the testing described herein can be a 186 kW, 460 VDC, 3565 RPM motor. However, other arrangements for the electric motor 22 are contemplated.

The testing system 20 can include a power supply 24, a data recorder 26, and a computing system 28. The power supply 24 can provide power to the electric motor 22 to power the electric motor 22 during testing. The data recorder 26 can record raw data of various operating parameters of the electric motor 22, which is transmitted to the computing system 28. The computing system 28 can process the raw data into results that aid in determining whether the electric motor 22 has passed or failed the testing being performed on the electric motor 22. Each of the power supply 24, the data recorder 26, and the computing system 28 will now be described in more detail.

The power supply 24 can be electrically coupled with a power source 30 that provides power to the power supply 24. In one embodiment, the power source 30 can be an on-site power distribution system that is located at a testing facility and can be easily connected to for testing purposes. In one embodiment, the power supply 24 can be selectively connected to the power source 30 via a disconnect 31. The disconnect 31 can include a terminal (not shown) that can be selectively decoupled from the power source 30 via an electrical switch (not shown) or other electrical coupling/decoupling device to allow for coupling of the power supply 24 thereto. The disconnect 31 can accordingly provide a location for easily connecting the power supply 24 to the power source 30.

The power supply 24 can provide electrical power to inputs 32 of the electric motor 22 for powering of the electric motor 22 from the power source 30. The power supply 24 can be a controllable (e.g., variable) supply that is configured to selectively output different voltages, currents, and/or power to the electric motor 22 (i.e., based on a user's input). The output of the power supply 24 to the inputs 32 can accordingly be adjusted to accommodate any of a variety of testing parameters for the electric motor 22, as will be described in more detail below. In one embodiment, as illustrated in FIG. 1, the electric motor 22 is shown to be a three-phase motor that receives three-phase power from the power supply 24, which is provided to the power supply 24 as three-phase power from the power source 30. For purposes of the discussion below, the testing is described in terms of three-phase power, but it is to be appreciated that any of a variety of other power arrangements are contemplated for testing, such as, for example, single-phase or two-phase power.

The data recorder 26 can be electrically coupled with the inputs 32 of the electric motor 22 and can be configured to measure and record raw data of each of the voltage, current, and power at the inputs 32 during testing of the electric motor 22. In one embodiment, a current transformer and a potential transformer can be provided at each of the inputs 32 and coupled with the data recorder 26 to facilitate recording of the raw data of the current and voltage, respectively, at each the inputs 32. During testing of the electric motor 22, the data recorder 26 can record the raw data of the voltage, current, and power at the inputs 32 at various time intervals over a period of time. The time intervals can be selected in order to achieve a high-resolution recording of the raw data. In one embodiment, the time intervals can occur at a sampling rate of between about 50 kHz and about 150 kHz, and preferably about 100 kHz, such that the recordings can be used to generate a substantially continuous curve of various parameters of the electric motor 22, as will be described in further detail below.

The data recorder 26 can also be coupled with a speed sensor 33 that facilitates detection and recording of raw data of an instantaneous speed of an output shaft (not shown) of the electric motor 22. In one embodiment, the speed sensor 33 can be a rotary encoder. In such an embodiment, the rotary encoder can be affixed to, and can have the same centerline as, the output shaft of the electric motor 22 and can provide a signal of N pulses per revolution. The instantaneous speed can be computed from the inverse of time electronically-located time between signal edge crossings. In another embodiment, the speed sensor 33 can comprise an inductive type sensor having a gear mounted on the shaft of the electric motor 22 and a fixed inductive sensor mounted adjacent to the gear (e.g., on a motor housing). In such an embodiment, the instantaneous speed of the electric motor 22 can be calculated from the inverse of time intervals between peaks of a signal obtained from passage of teeth on the gear as the teeth rotate near the inductive sensor. It is to be appreciated that different parameters of the electric motor 22 can be determined from the detected speed. For example, acceleration can be obtained by differentiation of the resulting speed vs time signal. Additional assessments, in accordance with versions described herein, can be made for data quality or reliability metrics. In another example, the speed signal can be differentiated, and multiplied by inertia to obtain torque, with the result subject to a procedure to achieve smooth appearance.

It is to be appreciated that the data recorder 26 can be coupled with any of a variety of suitable sensors for measuring and recording raw data of other parameters of the electric motor 22 that may be of interest during testing. For example, the data recorder 26 can be coupled with a winding temperature sensor to record raw data of the temperature of the electric motor 22 during testing.

The computing system 28 can be configured to process the raw data recorded by the data recorder 26 into desired results in a format that is convenient for reporting and archiving in an end user's information environment. As illustrated in FIG. 1, the computing system 28 can include an analysis controller 34 that is communicatively coupled with local storage 36 and permanent storage 38. During testing of the electric motor 22, the raw data from the data recorder 26 can first be stored in the local storage 36. The analysis controller 34 can retrieve the raw data from the local storage 36 (e.g., transient storage such as random access memory) for processing and presentation to a user. The results from the analysis controller 34 can be stored in the permanent storage 38 (e.g., a hard disk drive or cloud-based storage) for subsequent recall by a user, if desired. It is to be appreciated that the raw data from the local storage 36 and/or the results from the analysis controller 34 can be manipulated to generate any of a variety of different types of meaningful test results from the raw data recorded by the data recorder 26. In one embodiment, as described below, the raw data can be manipulated by the analysis controller 34 to generate plots of different parameters of the electric motor 22 that facilitate validation of the performance data of the electric motor 22.

In one embodiment, the computing system 28 can be a personal computer (e.g., a desktop or a laptop). In such an embodiment, the local storage 36 can comprise transient memory and the permanent storage 38 can include a hard disk drive. The analysis controller 34 can be implemented in software on the hard disk drive. The personal computer can also include a digital acquisition card for receiving the raw data from the data recorder 26. The personal computer can include a display device (e.g., a monitor) (not shown) that is configured to present the test results to the user. The computing system 28 can additionally or alternatively be coupled with a printer (not shown) for physical printing of the test results. It is to be appreciated that any of a variety of suitable alternative computing systems are contemplated for conducting the testing described below.

The computing system 28 can additionally include a test and safety monitor 40 that is configured to monitor the power supply 24 and the raw data in the local storage 36 and notify a user (e.g., via the monitor) when any testing abnormalities and/or safety concerns that could affect the testing procedure have occurred.

Referring now to FIGS. 2-5, a method of performing a no-load test of different line-to-line voltages (e.g., "across the line" voltages) on the electrical motor 22 using the testing system 20, and determining whether the electric motor 22 has passed or failed the no-load test will now be described. A test being described as a no-load test can be understood to mean that an external load (e.g., a dynamometer) is not mechanically connected to an output of the electric motor 22 during testing. Rather, the no-load test is performed simply using the core properties of the electric motor 22 (e.g., the inertia, friction load, and windage load) as the load on the output of the electric motor 22. For purposes of the no-load test described below with respect to FIGS. 2-5, the data recorder 26 can be configured to record the instantaneous speed of the electric motor 22 (e.g., via the speed sensor 33) over time (e.g., a speed test). For each test run described below, the different line-to-line voltages can be selectively generated by the power supply 24 and controlled either manually (e.g., via a knob or a key pad) or automatically (e.g., by the computing system 28). In addition, for purposes of the discussion of the no-load test below, it is to be assumed that the data recorder 26 and the computing system 28 have been enabled (e.g., electrically connected to the inputs 32) and are fully operational (e.g., booted up) prior to each test run.

To conduct the first test run, the data recorder 26 can first be activated to begin recording raw data for the instantaneous speed of the electric motor 22. A line-to-line voltage V1 of about 116 VDC can then be applied to the inputs 32 to start the electric motor 22 (e.g., start time) and accelerate it to a steady state speed (e.g., approximately synchronous speed). Once the steady state speed is reached and maintained for a short time period (e.g., between about 5-10 seconds), the line-to-line voltage V1 can be removed from the inputs 32 (e.g., to turn the electric motor 22 off) and the electric motor 22 can decelerate (e.g., coast down) from the steady state speed to rest. The data recorder 26 can then be deactivated (e.g., to stop recording the raw data of the electric motor 22) to complete the first test run.

A second test run can then be conducted by activating the data recorder 26 again and applying a line-to-line voltage V2 of about 202 VDC to start the electric motor 22, accelerate it to a steady state speed, and operate the electric motor 22 at that steady state speed for a short time period (e.g., between about 5-10 seconds). The line-to-line voltage V2 can then be removed from the inputs 32 to decelerate the electric motor 22 from the steady state speed to rest. The data recorder 26 can then be deactivated to complete the second test run.

A third test run can then be conducted by activating the data recorder 26 again and applying a line-to-line voltage V3 of about 231 VDC to start the electric motor 22, accelerate it to a steady state speed, and operate the electric motor 22 at that steady state speed for a short time period (e.g., between about 5-10 seconds). The line-to-line voltage V3 can then be removed from the inputs 32 to decelerate the electric motor 22 from the steady state speed to rest. The data recorder 26 can then be deactivated to complete the third test run.

A fourth test run can then be conducted by activating the data recorder 26 again and applying a line-to-line voltage V4 of about 363 VDC to start the electric motor 22, accelerate it to a steady state speed, and operate the electric motor 22 at that steady state speed for a short time period (e.g., between about 5-10 seconds). The line-to-line voltage V4 can then be removed from the inputs 32 to decelerate the electric motor 22 from the steady state speed to rest. The data recorder 26 can then be deactivated to complete the fourth test run.

A fifth test run can then be conducted by activating the data recorder 26 again and applying a line-to-line voltage V5 of about 462 VDC to start the electric motor 22, accelerate it to a steady state speed, and operate the electric motor 22 at that steady state speed for a short time period (e.g., between about 5-10 seconds). The line-to-line voltage V5 can then be removed from the inputs 32 to decelerate the electric motor 22 from the steady state speed to rest. The data recorder 26 can then be deactivated to complete the fifth test run.

Figure 2:
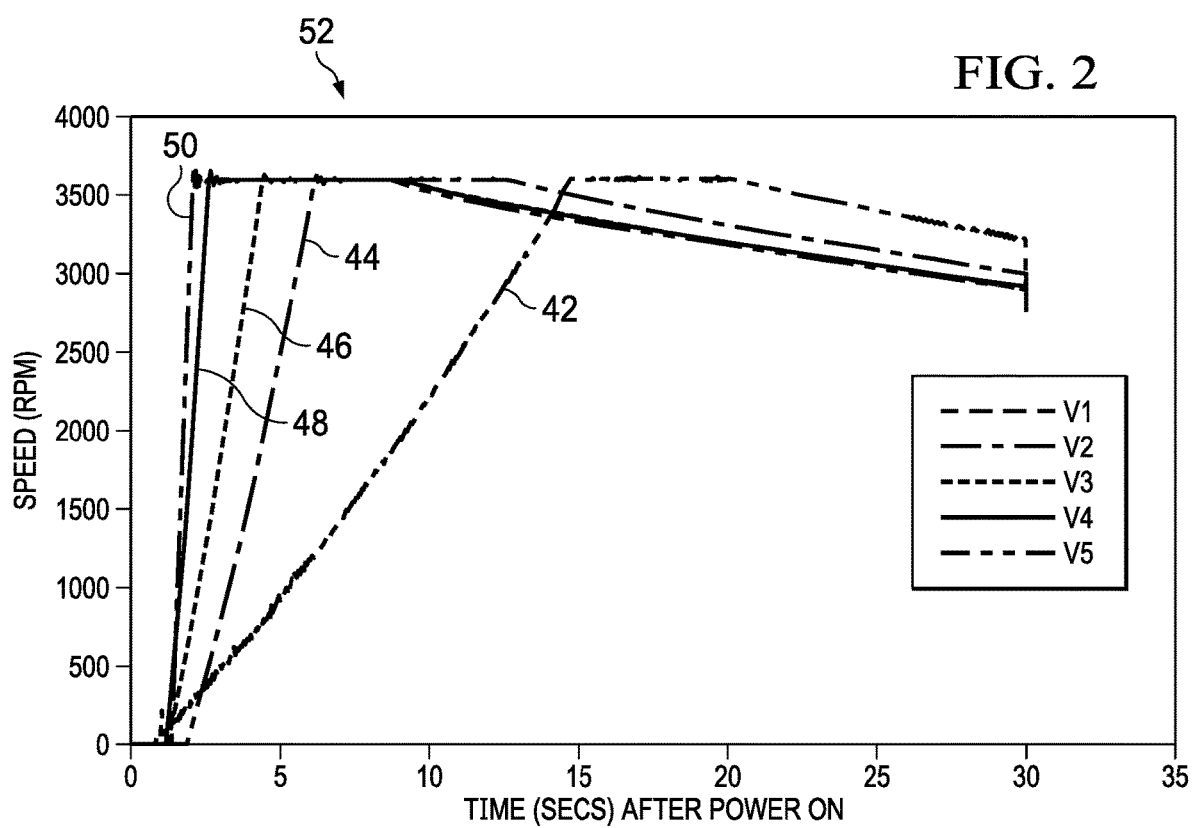
FIG. 2 is a plot of a plurality of curves depicting a relationship between motor speed and time during an across-the-line start, for a plurality of different line-to-line voltages.

Referring now to FIG. 2, respective curves (e.g., 42, 44, 46, 48, 50) of the speed of the electric motor 22 as a function of time can be generated (e.g., by the analysis controller 34) for each of the first, second, third, fourth, and fifth test runs on a graph 52 from the raw data recorded by the data recorder 26. The graph 52 can be a Cartesian graph having a linear vertical axis (y-axis) and a linear horizontal axis (x-axis). The speed of the electric motor 22 can be plotted on the linear vertical axis and time can be plotted on the linear horizontal axis. The zero time (e.g., t=0) on the graph 52 can represent the time at which the data recorder 26 first began recording. In such an embodiment, the raw data from each of the test runs can be stored in the local storage 36 after each test run and then retrieved by the analysis controller 34 after the test runs are complete to generate each of the curves 42, 44, 46, 48, 50 on the graph 52. In an alternative embodiment, each of the curves 42, 44, 46, 48, 50 can be generated on the graph 52 immediately after each test run has been completed.

It is to be appreciated that the magnitude of the line-to-line voltages V1, V2, V3, V4, V5 described above are merely illustrative and that any of a variety of suitable alternative magnitudes can be used for a particular no-load test. It is also to be appreciated that although five test runs are described for the no-load test, a no-load test might include two, three or four test runs or more than five test runs.

Figure 3:
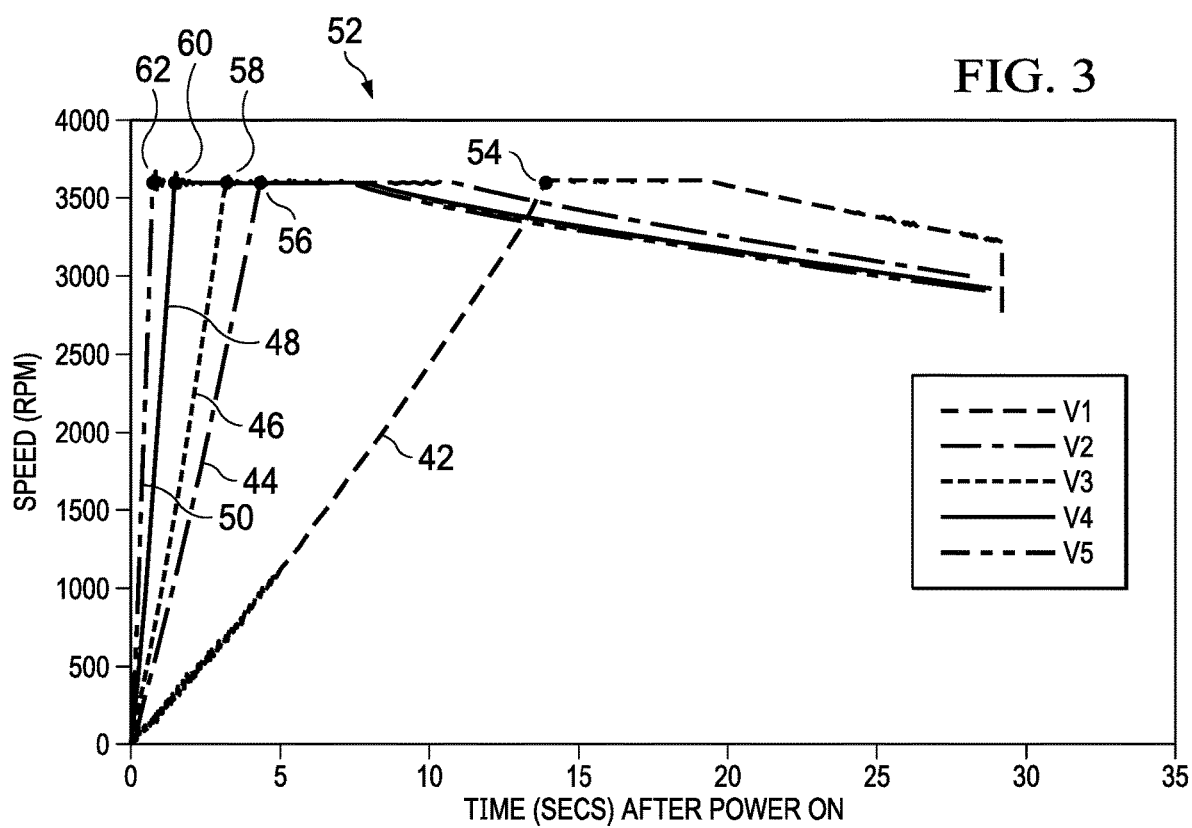
FIG. 3 is a plot of the plurality of curves of FIG. 2, but with the curves time-shifted.

As illustrated in FIG. 2, the start time of the electric motor 22 for each of the test runs can be delayed relative to zero time as a result of activating the data recorder 26 before starting the electric motor 22. The curves 42, 44, 46, 48, 50 can accordingly be shifted along the horizontal axis to align the start time of the electric motor 22 of each of the curves 42, 44, 46, 48, 50 with zero time, as illustrated in FIG. 3. A steady state speed start time 54, 56, 58, 60, and 62 of the electric motor 22 can be determined for each of the first, second, third, fourth, and fifth test runs, respectively, from the curves 42, 44, 46, 48, 50 illustrated in FIG. 3. The steady state start time of the electric motor 22 can be understood to mean the elapsed time between the start time of the electric motor 22 and the time that the electric motor 22 reaches its steady state speed (i.e., is no longer accelerating.

Figure 4:
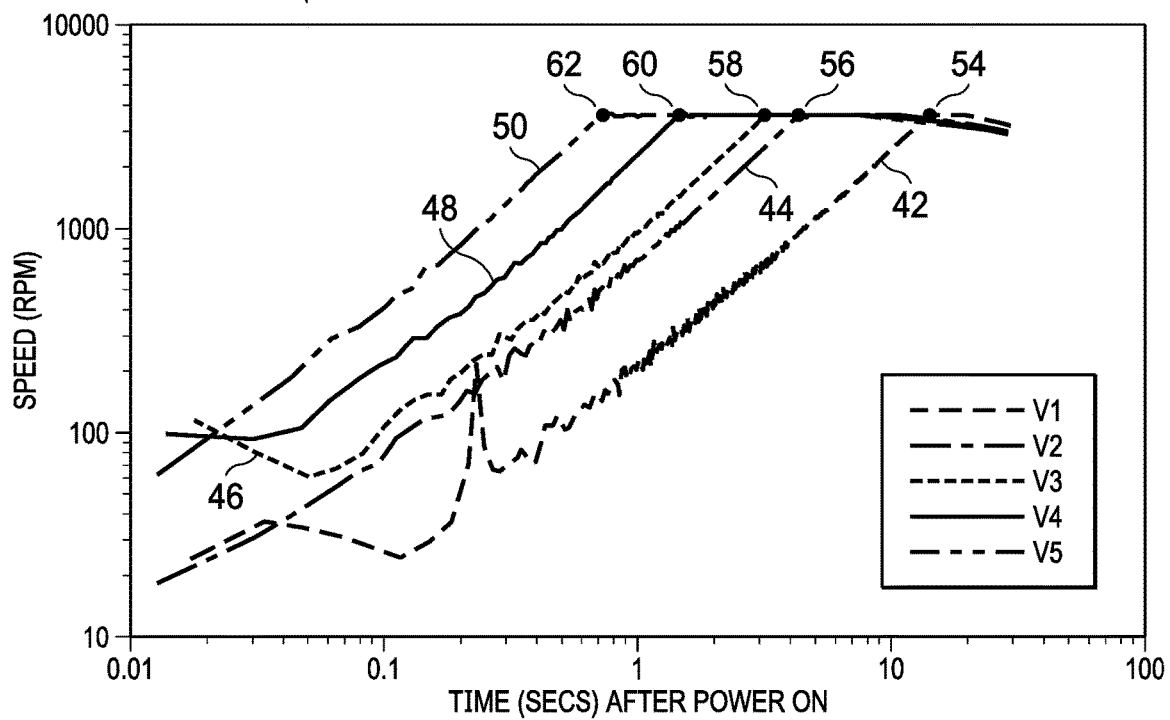
FIG. 4 is a plot of the plurality of curves of FIG. 3, but depicted logarithmically on a graph having a vertical axis and a horizontal axis shown in logarithmic scale.
Figure 5:
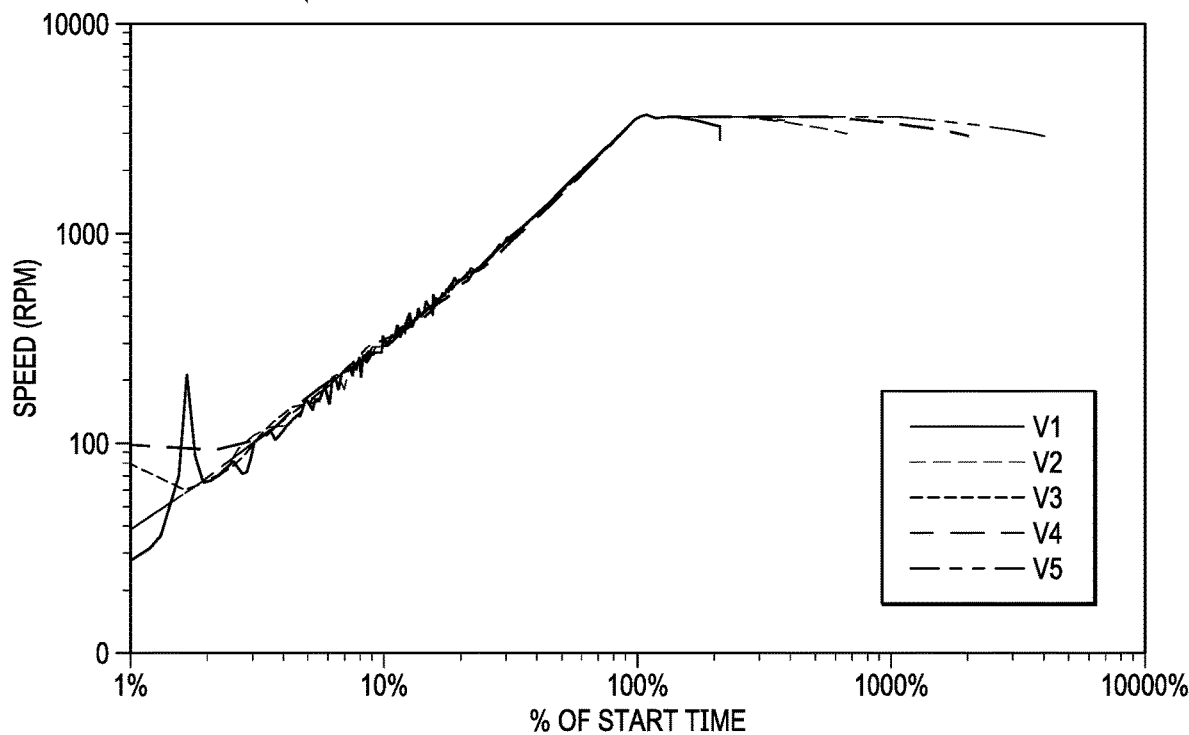
FIG. 5 is a plot of the plurality of curves of FIG. 4, but with the curves time-shifted such that steady state speed start times depicted on each of the curves are substantially aligned relative to the horizontal axis.

The curves 42, 44, 46, 48, 50 and the graph 52 shown in FIG. 3 can then be rescaled into a log-log format such that the curves 42, 44, 46, 48, 50 are depicted logarithmically on a graph 53 having a vertical axis and a horizontal axis shown in logarithmic scale, as illustrated in FIG. 4. The curves 42, 44, 46, 48, 50 can then be shifted along the horizontal axis (e.g., time-shifted) such that the steady state speed start times 54, 56, 58, 60, and 62 are all aligned relative to the horizontal axis and the linear horizontal axis is plotted as a function of percentage of start time, as illustrated in FIG. 5. The degree of similarity of curves 42, 44, 46, 48, 50 illustrated in FIG. 5 can provide a first indication of whether the electric motor 22 has passed or failed the no-load test. For example, if the curves 42, 44, 46, 48, 50 are substantially aligned (e.g., the slopes of each curve are substantially aligned with the slopes of the other curves), as illustrated in FIG. 5, the electric motor 22 can be considered to have passed a first confidence level. However, if at least one of the curves 42, 44, 46, 48, 50 diverges from the rest of the curves 42, 44, 46, 48, 50 (e.g., at least one slope of a curve is not substantially aligned with the corresponding slope of the other curves), the electric motor 22 can be considered to have failed the no-load test (e.g., due to a problem with the electric motor 22 and/or a problem with the nature of the testing).

In one embodiment, the curves 42, 44, 46, 48, 50 illustrated in FIG. 5 can be presented to a user on a monitor and/or in printed form so that a user can visually inspect the results to compare the curves 42, 44, 46, 48, 50 to determine whether the electric motor 22 has passed or failed the no-load test. In another embodiment, the curves 42, 44, 46, 48, 50 illustrated in FIG. 5 can be analyzed by the computing system to determine whether the electric motor 22 has passed or failed the no-load test.

The method of performing the no-load test described above with respect to FIGS. 2-5 can correlate the curves 42, 44, 46, 48, 50 of the no-load test together to provide an easy to read graphical representation of whether the electric motor 22 has passed or failed the no-load test. As such, the method can provide convenient, traceable and reproducible metrics and cross checks as evidence of credibility and correctness, including allowance for and correction of effects external to the motor that may be unavoidably introduced by the facility's power system used to operate the electric motor 22.

Referring now to FIGS. 6-13, a method of performing a no-load, locked rotor test of different line-to-line voltages (e.g., "across the line" voltages) on the electrical motor 22 using the testing system 20, and determining whether the electric motor 22 has passed or failed the no-load, locked rotor test will now be described. For purposes of the no-load, locked rotor test described below with respect to FIGS. 6-13, the data recorder 26 can be configured to record the voltage and the current at the inputs 32 as well as the instantaneous speed of the electric motor 22 (e.g., via the speed sensor 33). For purposes of the discussion of the no-load, locked rotor test below, it is to be assumed that the data recorder 26 and the computing system 28 have been enabled (e.g., electrically connected to the inputs 32) and are fully operational (e.g., booted up) prior to each test run.

To conduct a first test run, the data recorder 26 can first be activated to begin recording raw data for the voltage and the current at the inputs 32 (e.g., the locked rotor voltage and locked rotor current, respectively) as well as for the instantaneous speed of the electric motor 22. A line-to-line voltage V11 of about 116 VDC can then be applied to the inputs 32 to start the electric motor 22 and accelerate it to a steady state speed. Once the steady state speed is reached, the line-to-line voltage V11 can be removed from the inputs 32 (e.g., to turn the electric motor 22 off) such that the electric motor 22 decelerates (e.g., coasts down) from the steady state speed to rest. The data recorder 26 can then be deactivated to complete the first test run.

A second test run can then be conducted by activating the data recorder 26 again and applying a line-to-line voltage V22 of about 202 VDC to start the electric motor 22 and accelerate it to a steady state speed. Once the steady state speed is reached, the line-to-line voltage V22 can be removed from the inputs 32 to decelerate the electric motor 22 from the steady state speed to rest. The data recorder 26 can then be deactivated to complete the second test run.

A third test run can then be conducted by activating the data recorder 26 again and applying a line-to-line voltage V33 of about 231 VDC to start the electric motor 22 and accelerate it to a steady state speed. Once the steady state speed is reached, the line-to-line voltage V33 can be removed from the inputs 32 to decelerate the electric motor 22 from the steady state speed to rest. The data recorder 26 can then be deactivated to complete the third test run.

A fourth test run can then be conducted by activating the data recorder 26 again and applying a line-to-line voltage V44 of about 363 VDC to start the electric motor 22 and accelerate it to a steady state speed. Once the steady state speed is reached, the line-to-line voltage V44 can be removed from the inputs 32 to decelerate the electric motor 22 from the steady state speed to rest. The data recorder 26 can then be deactivated to complete the fourth test run.

A fifth test run can then be conducted by activating the data recorder 26 again and applying a line-to-line voltage V55 of about 462 VDC to start the electric motor 22 and accelerate it to a steady state speed. Once the steady state speed is reached, the line-to-line voltage V55 can be removed from the inputs 32 to decelerate the electric motor 22 from the steady state speed to rest. The data recorder 26 can then be deactivated to complete the fifth test run.

Figure 6:
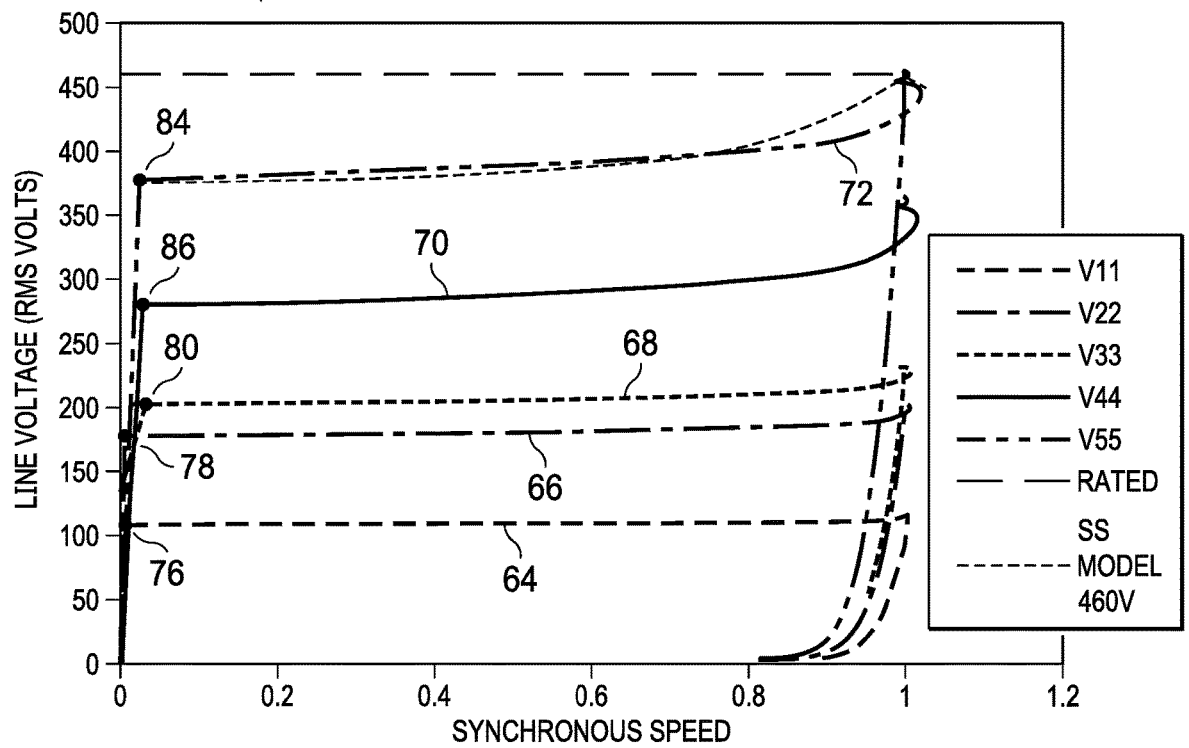
FIG. 6 is a plot of a plurality of curves depicting a relationship between line voltage and motor speed during an across-the-line start, for a plurality of different line-to-line voltages.

Referring now to FIG. 6, respective curves (e.g., 64, 66, 68, 70, 72) of the line voltage (RMS) measured at the inputs 32 of the electric motor 22 as a function of speed can be generated (e.g., by the analysis controller 34) for each of the first, second, third, fourth, and fifth test runs on a graph 74 from the raw data recorded by the data recorder 26. The graph 74 can be a Cartesian graph having a linear vertical axis (y-axis) and a linear horizontal axis (x-axis). The line voltage of the electric motor 22 can be plotted on the linear vertical axis and the synchronous speed can be plotted on the linear horizontal axis. It is to be appreciated from the curves 64, 66, 68, 70, 72 that the line voltage of the electric motor 22 can sag for a significant portion of the acceleration of the electric motor 22 to steady state speed. This voltage sag can be a function of the losses inherent to the collective arrangement of the elements supplying power to the electric motor 22 during startup (e.g., the power supply 24, the power source 30, and the disconnect 31, illustrated in FIG. 1).

A startup line voltage value (e.g., 76, 78, 80, 82, 84) for the electric motor 22 can be determined from the curves 64, 66, 68, 70, 72 illustrated in FIG. 6 for each of the first, second, third, fourth, and fifth test runs, respectively. The startup line voltage value for the electric motor 22 can be understood to mean the RMS magnitude of the voltage at the inputs 32 at startup once the transient(s) related to switching on of the power (e.g., the power supply 24, the power source 30, and the disconnect 31, illustrated in FIG. 1) and the speed of the electric motor 22 is no longer spiking (i.e., once the speed of the electric motor 22 has begun to stabilize, which typically occurs at between about 1% and about 3% of the synchronous speed rating (RPM) for the electric motor 22).

Figure 7:
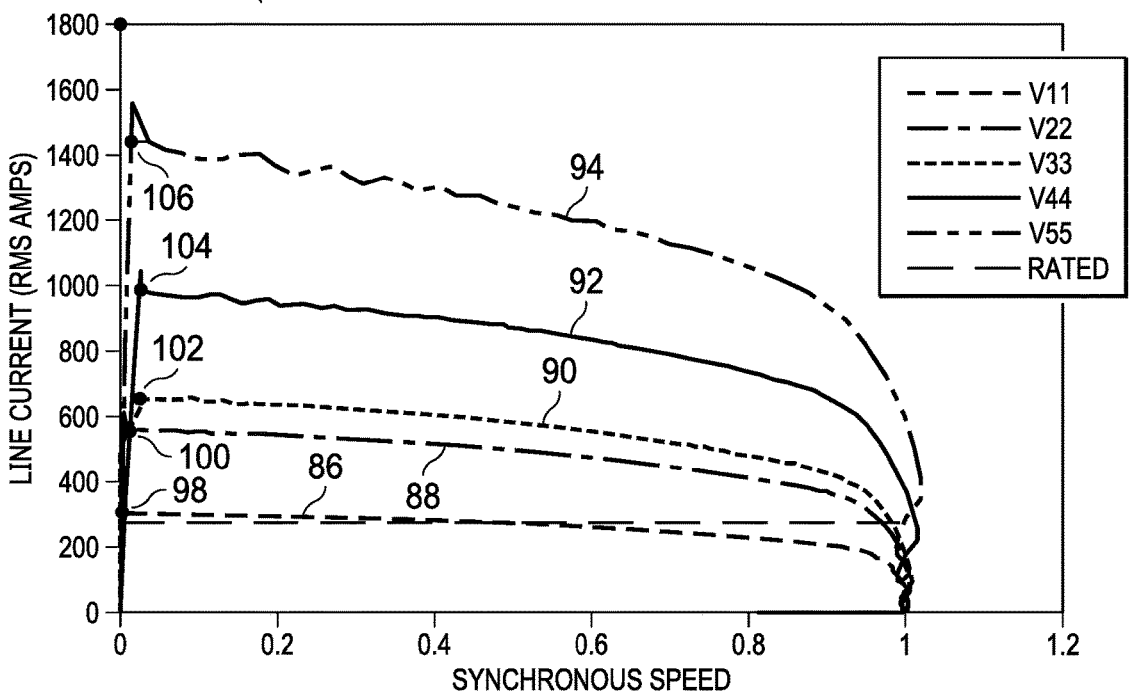
FIG. 7 is a plot of a plurality of curves depicting a relationship between line current and motor speed during an across-the-line start, for the different line-to-line voltages illustrated in FIG. 6.

Referring now to FIG. 7, respective curves (e.g., 86, 88, 90, 92, 94) of the line current of the electric motor 22 as a function of speed can be generated (e.g., by the analysis controller 34) for each of the first, second, third, fourth, and fifth test runs on a graph 96 from the raw data recorded by the data recorder 26. The graph 96 can be a Cartesian graph having a linear vertical axis (y-axis) and a linear horizontal axis (x-axis). The line current of the electric motor 22 can be plotted on the linear vertical axis and the synchronous speed can be plotted on the linear horizontal axis.

A startup line current value (e.g., 98, 100, 102, 104, 106) of the electric motor 22 can be determined from the curves 86, 88, 90, 92, 94 illustrated in FIG. 7 for each of the first, second, third, fourth, and fifth test runs, respectively. The startup line current value of the electric motor 22 can be understood to mean the RMS magnitude of the current at the inputs 32 at startup once the transient(s) related to switching on of the power (e.g., the power supply 24, the power source 30, and the disconnect 31, illustrated in FIG. 1) is overcome and the speed of the electric motor 22 is no longer spiking (i.e., once the speed of the electric motor 22 has begun to stabilize, which typically occurs at between about 1% and about 3% of the overall RPM rating for the electric motor 22).

Figure 8:
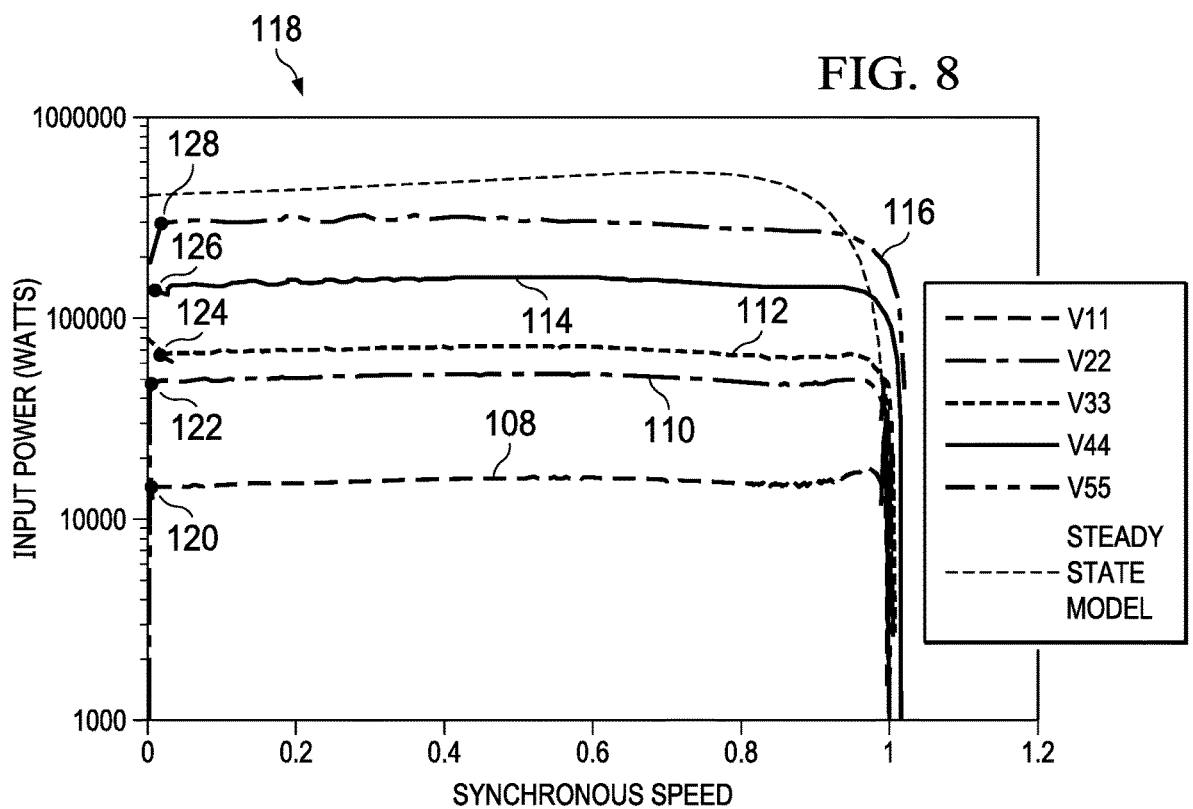
FIG. 8 is a plot of a plurality of curves depicting a relationship between input power and motor speed for the different line-to-line voltages illustrated in FIG. 6.

Referring now to FIG. 8, respective curves (e.g., 108, 110, 112, 114, 116) of the input power to the electric motor 22 as a function of speed can be generated (e.g., by the analysis controller 34) for each of the first, second, third, fourth, and fifth test runs on a graph 118 from the raw data recorded by the data recorder 26. The input power can be calculated from the line voltages and line currents illustrated in FIGS. 6 and 7, respectively. The graph 118 can be a Cartesian graph having a linear vertical axis (y-axis) and a linear horizontal axis (x-axis). The input power of the electric motor 22 can be plotted on the linear vertical axis and the synchronous speed can be plotted on the linear horizontal axis.

An input power value (e.g., 120, 122, 124, 126, 128) of the electric motor 22 can be determined from the curves 108, 110, 112, 114, 116 illustrated in FIG. 8 for each of the first, second, third, fourth, and fifth test runs, respectively. The input power value of the electric motor 22 can be understood to mean the RMS magnitude of the power at the inputs 32 at startup once the transient(s) related to switching on of the power (24,30 and 31 in FIG. 1) is overcome and the speed of the electric motor 22 is no longer oscillating (i.e., once the speed of the electric motor 22 has begun to stabilize which typically occurs at between about 1% and about 3% of the overall RPM rating for the electric motor 22).

Figure 9:
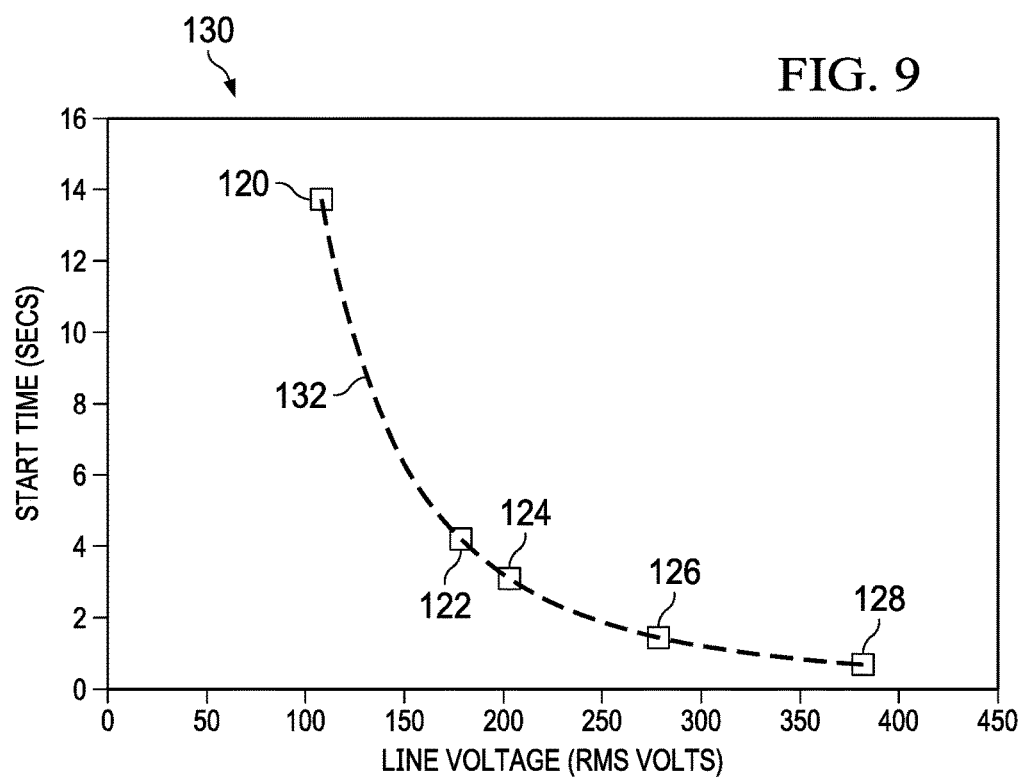
FIG. 9 is a plot of a curve depicting a relationship between start times of the electric motor and startup locked rotor voltage values for the different line-to-line voltages illustrated in FIG. 6.

Referring now to FIG. 9, the start times for each of the first, second, third, fourth and fifth test runs (e.g., the elapsed time from startup of the electric motor 22 to synchronous speed) can be plotted as points 120, 122, 124, 126, 128, respectively, on a graph 130 as a function of their startup line voltage values determined in FIG. 6. The start times of the test runs can be obtained from the no-load test method described above with respect to FIG. 3 (when performing the locked rotor, no-load test in conjunction with the no-load test) or can be obtained separately but in a similar manner as described above for the no-load test described above with respect to FIG. 3 (when performing the locked rotor, no load test independently of the no-load test). The graph 130 can be a Cartesian graph having a linear vertical axis (y-axis) and a linear horizontal axis (x-axis). The start times of the electric motor 22 can be plotted on the linear vertical axis and the line voltage values can be plotted on the linear horizontal axis. The points 120, 122, 124, 126, 128 can then be curve fit to generate a curve 132 (e.g., shown as a dotted line).

Figure 10:
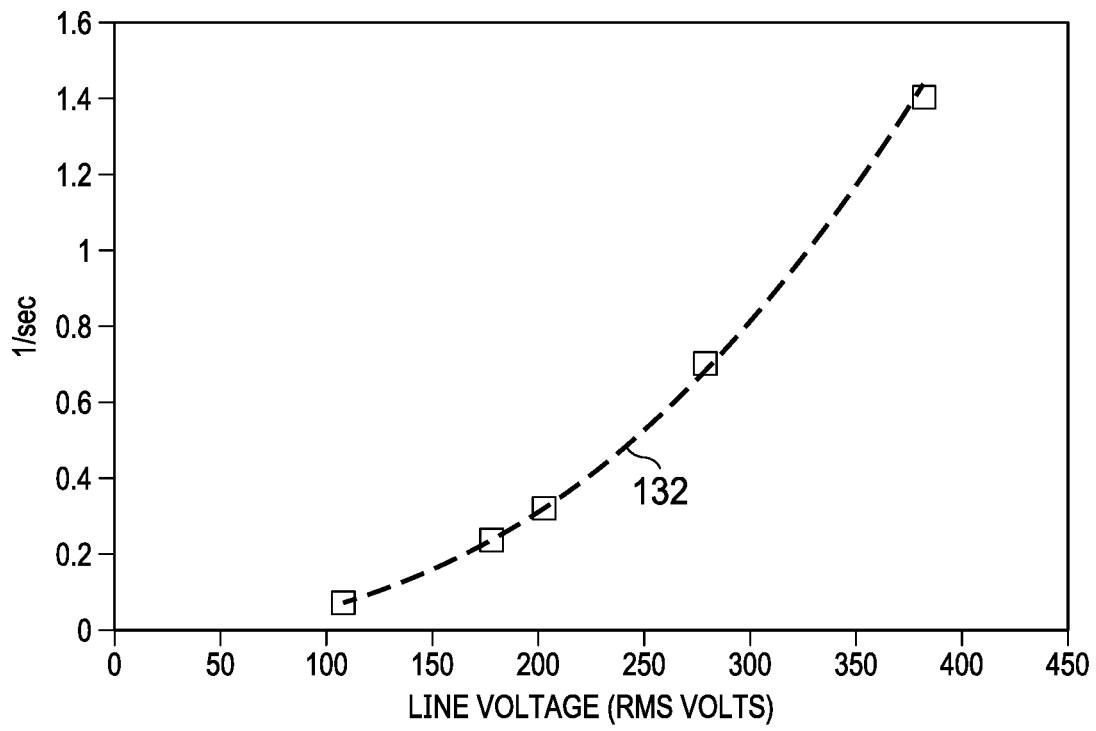
FIG. 10 is a plot of the curve of FIG. 9, but with the curve inverted along the vertical axis.
Figure 11:
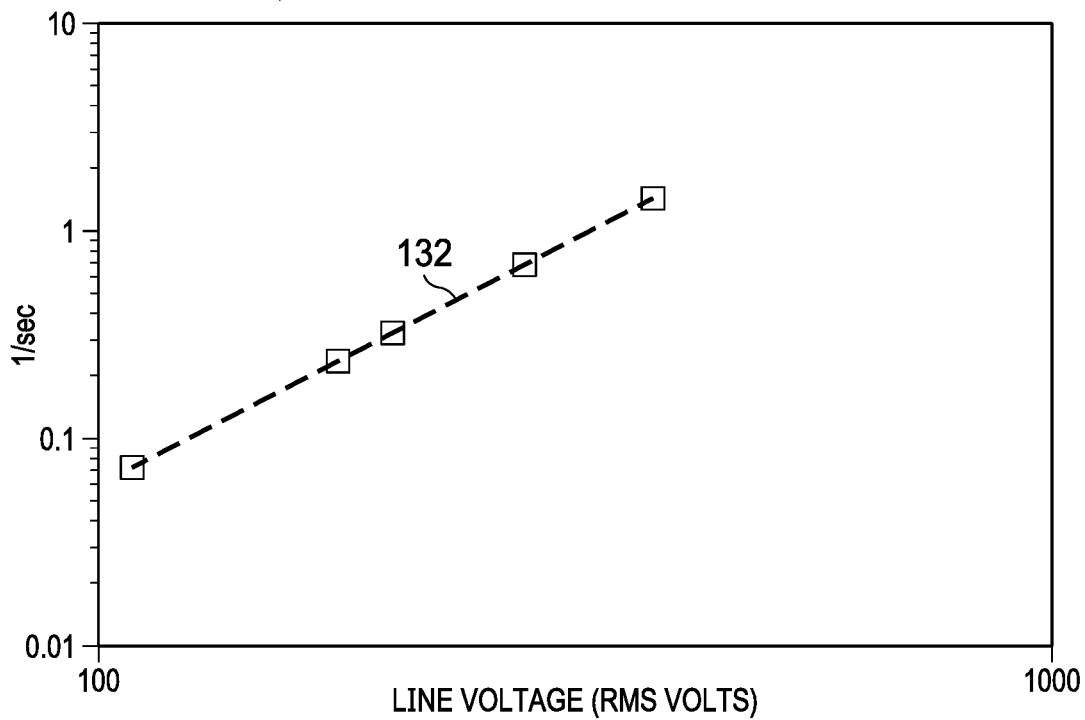
FIG. 11 is a plot of the curve of FIG. 10, but depicted on a graph having a vertical axis and a horizontal axis both shown in logarithmic scale.

The curve 132 of FIG. 9 can be inverted along the vertical axis, as illustrated in FIG. 10 such that inverse time (1/time) is plotted along the vertical scale. The curve 132 can then be rescaled into a log-log format such that the curve 132 is depicted on a graph 134 having a vertical axis and a horizontal axis both shown in logarithmic scale rescaled into a log-log format, as illustrated in FIG. 11. One important metric obtained from the slope of the curve 132 illustrated in FIG. 11 can be the exponent B in the power expression:

$$Y=AX^B$$

The value of the slope of the curve 132 therefore defines the non-linear power characteristics that are unique to the electric motor 22 as a function of the variable and non-linear electromagnetic fields that are distributed in the electric motor 22 under various operating conditions (e.g., speed, load, and voltage), the geometry of the core, windings and rotor, variation in the supply voltage due to resistance in the motor leads, as well as non-linear characteristics of the source, for example.

Figure 12:
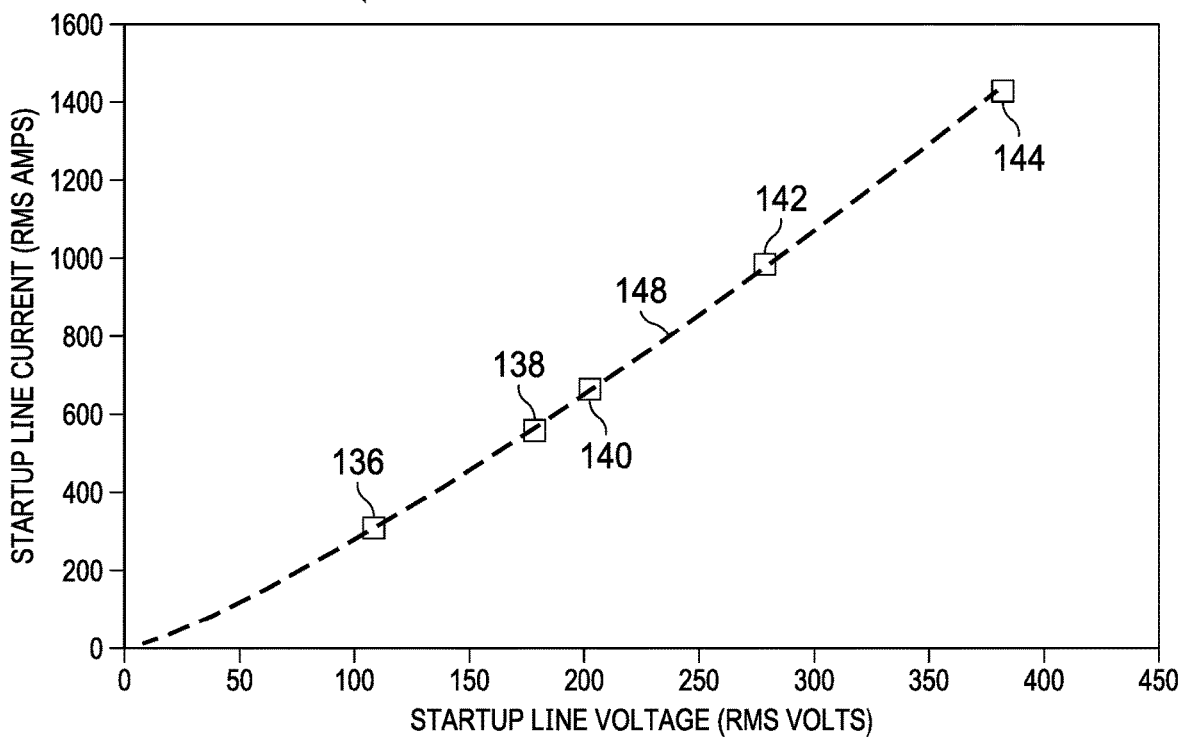
FIG. 12 is a plot of a curve depicting a relationship between startup locked rotor voltage values and startup locked rotor current values for the different line-to-line voltages illustrated in FIG. 6.

Referring now to FIG. 12, the startup line current values determined in FIG. 7 for each of the first, second, third, fourth and fifth test runs can be plotted as points 136, 138, 140, 142, 144, respectively, on a graph 146 as a function of their startup line voltage values determined in FIG. 6. The graph 146 can be a Cartesian graph having a linear vertical axis (y-axis) and a linear horizontal axis (x-axis). The startup line voltage values of the electric motor 22 can be plotted on the linear vertical axis and the startup line current values can be plotted on the linear horizontal axis. The points 136, 138, 140, 142, 144 can then be curve fit to generate a curve 148 (e.g., shown as a dotted line). The exponent for the slope of the curve 148 illustrated in FIG. 12 will be about half of the magnitude of the slope of the curve 132 illustrated in FIG. 11.

Figure 13:
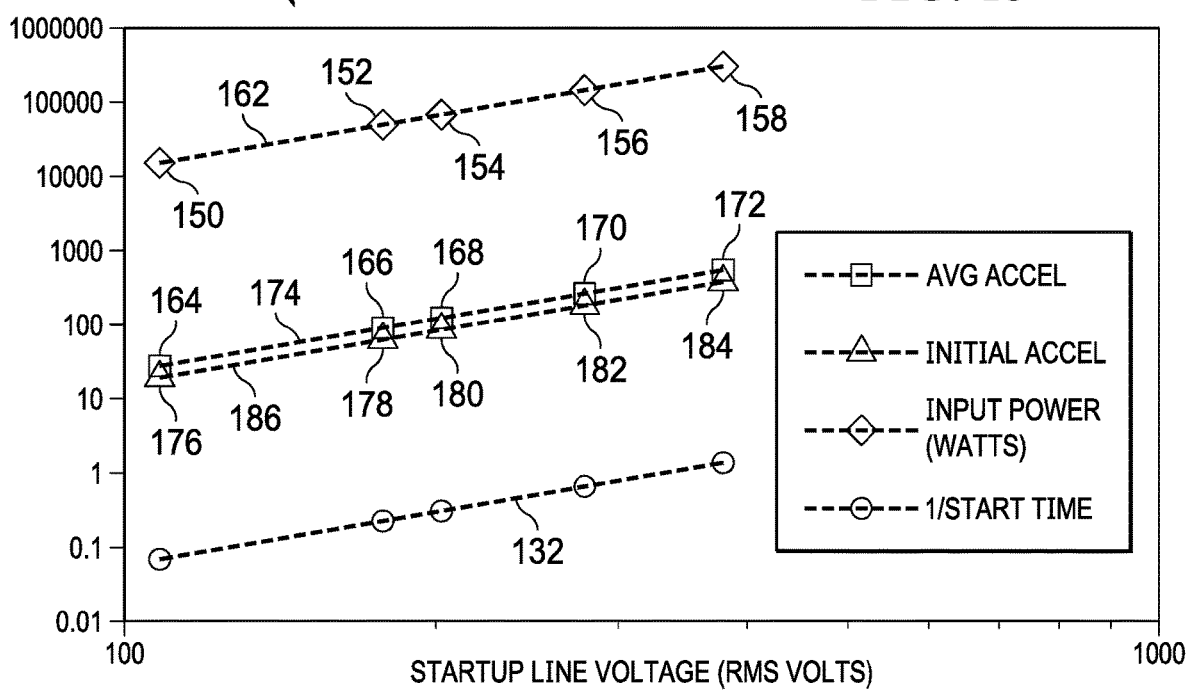
FIG. 13 is a plot of a plurality of curves obtained during no-load starts.

Referring now to FIG. 13, the input power values determined in FIG. 8 for each of the first, second, third, fourth and fifth test runs can be plotted as points 150, 152, 154, 156, 158, respectively, on a graph 160 as a function of their startup locked rotor voltage values determined in FIG. 6. The graph 160 can be a Cartesian graph having a linear vertical axis (y-axis) and a logarithmic horizontal axis (x-axis). The linear vertical axis can be unitless and the startup line voltage values can be plotted on the log horizontal axis. The points 150, 152, 154, 156, 158 can then be curve fit to generate a curve 162 (e.g., shown as a dotted line).

Average acceleration values for each of the first, second, third, fourth and fifth test runs can be plotted as points 164, 166, 168, 170, 172, respectively, on the graph 160 as a function of their startup locked rotor voltage values. An average acceleration value can be understood to mean the average acceleration of the electric motor 22 between startup and its steady state speed start time. The average acceleration values can be determined from the raw data recorded by the data recorder 26 during the no-load, locked rotor test. The points 164, 166, 168, 170, 172 can then be curve fit to generate a curve 174 (e.g., shown as a dotted line).

Initial (e.g., locked rotor) acceleration values for each of the first, second, third, fourth and fifth test runs can be plotted as points 176, 178, 180, 182, 184, respectively, on the graph 160 as a function of their startup locked rotor voltage values. An initial (e.g., locked rotor) acceleration value can be understood to mean the instantaneous acceleration of the electric motor 22 at startup of the electric motor. The initial acceleration values can be determined from the raw data recorded by the data recorder 26 during the no-load, locked rotor test. In one embodiment, the instantaneous acceleration can be calculated by differentiating the signal from the speed sensor 33. The points 176, 178, 180, 182, 184 can then be curve fit to generate a curve 186 (e.g., shown as a dotted line).

The curve 132 that was generated from the 1/(start times) of each of the first, second, third, fourth and fifth test runs as a function of their startup line voltage values in FIG. 11 can be generated on the graph 160.

The curves 132, 162, 174, 186 illustrated in FIG. 13 can provide an indication of whether the electric motor 22 has passed or failed the no-load, locked rotor test. For example, if the curves 132, 162, 174, 186 have substantially similar slopes, as illustrated in FIG. 13, the electric motor 22 can be considered to have passed the no-load, locked rotor test. However, if at least one of the curves 132, 162, 174, 186 has a different slope from the rest of the curves 132, 162, 174, 186, the electric motor 22 can be considered to have failed the no-load test, locked rotor test (e.g., due to a problem with the electric motor 22 and/or a problem with the nature of the testing).

In one embodiment, the curves 132, 162, 174, 186 illustrated in FIG. 13 can be presented to a user on a monitor and/or in printed form so that a user can visually inspect the results to compare the curves 132, 162, 174, 186 to determine whether the electric motor 22 has passed or failed the no-load, locked rotor test. In another embodiment, the curves 132, 162, 174, 186 illustrated in FIG. 13 can be analyzed by the computing system 28 to determine whether the electric motor 22 has passed or failed the no-load test.

The method of performing the no-load, locked rotor test described above with respect to FIGS. 6-13 can correlate the curves 132, 162, 174, 186 of the no-load, locked rotor test to provide an easy to read graphical representation of whether the electric motor 22 has passed or failed the no-load, locked rotor test. As such, the method can provide convenient, traceable and reproducible metrics and cross checks as evidence of credibility and correctness, including allowance for and correction of effects external to the motor that may be unavoidably introduced by the facility's power system used to operate the electric motor 22.

Referring now to FIGS. 14-17, a method of performing a no-load test at different line-to-line voltages (e.g., "across the line" voltages) on the electrical motor 22 using the testing system 20 for purposes of calculating losses and an inertia of the electric motor 22 for the different line-to-line voltages will now be described. For purposes of the no-load test described below with respect to FIGS. 14-17, the data recorder 26 can be configured to record the voltage and the current at the inputs 32 as well as the instantaneous speed of the electric motor 22 (e.g., via the speed sensor 33). For purposes of the discussion of the no-load rotor test below, it is to be assumed that the data recorder 26 and the computing system 28 have been enabled (e.g., electrically connected to the inputs 32) and are fully operational (e.g., booted up) prior to each test run.

To conduct the first test run, the data recorder 26 can first be activated to begin recording raw data for the voltage and the current at the inputs 32 (e.g., the line voltage and the line current, respectively) as well as for the instantaneous speed of the electric motor 22. A line-to-line voltage V111 of about 100 VDC can then be applied to the inputs 32 to start the electric motor 22 and accelerate it to a steady state speed. Once the steady state speed is reached and maintained for a period of time (e.g., between about 20-30 seconds), the data recorder 26 can then be deactivated (e.g., to stop recording the raw data of the electric motor 22) to complete the first test run.

A second, third, fourth and fifth test run can be conducted in a similar manner as described above with respect to the first test run, but instead using a line-to-line voltage V222 of about 208 VDC for the second test run, a line-to-line voltage V333 of about 230 VDC for the third test run, a line-to-line voltage V444 of about 380 VDC for the fourth test run, and a line-to-line voltage V555 of about 460 VDC for the fifth test run.

Figure 14:
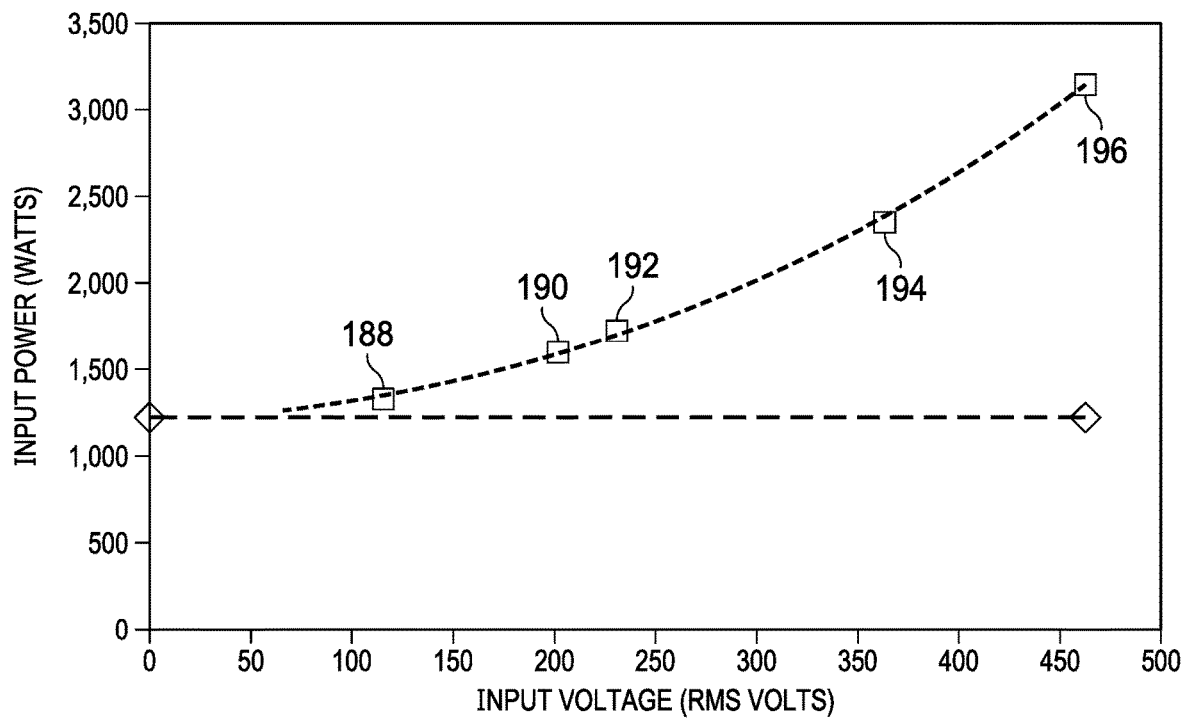
FIG. 14 is a plot of a curve depicting a relationship between input power of the electric motor and a plurality of different locked rotor line-to-line voltages.

Referring now to FIG. 14, the friction, windage, and core losses of the electric motor 22 can be determined for each of the first, second, third, fourth and fifth test runs by plotting the input power minus rotor copper loss (calculated as measured current squared times DC resistance of the winding, where DC resistance R can be obtained independently) at the inputs 32 of the electric motor 22 as respective points 188, 190, 192, 194, 196 on a graph 198 as a function of the respective line-to-line voltages. The graph 198 can be a Cartesian graph having a linear vertical axis (y-axis) and a linear horizontal axis (x-axis). The input power can be plotted on the linear vertical axis and the line-to-line voltages can be plotted on the linear horizontal axis. The points 188, 190, 192, 194, 196 can then be curve fit to generate a curve 200 (e.g., shown as a dotted line) whose value at the intersection of zero voltage, is representative of the friction and windage losses of the electric motor 22 as a constant at approximately synchronous speed and any voltage; and the variation experienced by the electric motor 22 as the input voltage is increased, represents the effect of core losses of the motor 22 as a function of applied terminal voltage.

Figure 15:
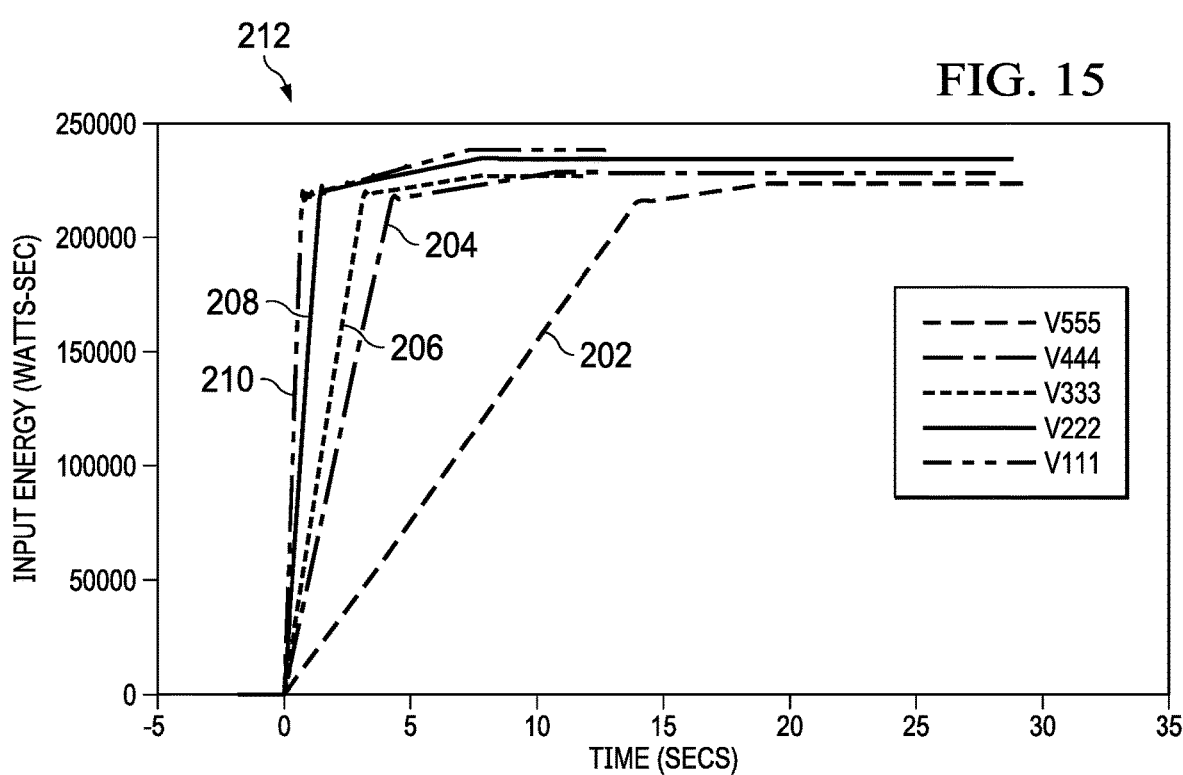
FIG. 15 is a plot of a plurality of curves depicting energy input as a function of time, under condition of the different line-to-line voltages illustrated in FIG. 14.

Respective curves of the input power of the electric motor as a function of time can be generated for each of the first, second, third, fourth, and fifth test runs and then integrated to generate the respective curves 202, 204, 206, 208, 210 on a graph 212, as illustrated in FIG. 15. The curves 202, 204, 206, 208, 210 can depict the measured energy input at the inputs 32 of the electric motor 22 for each of the first, second, third, fourth, and fifth test runs, respectively. The graph 212 can be a Cartesian graph having a linear vertical axis (y-axis) and a linear horizontal axis (x-axis). The input energy can be plotted on the linear vertical axis and time can be plotted on the linear horizontal axis.

Figure 16:
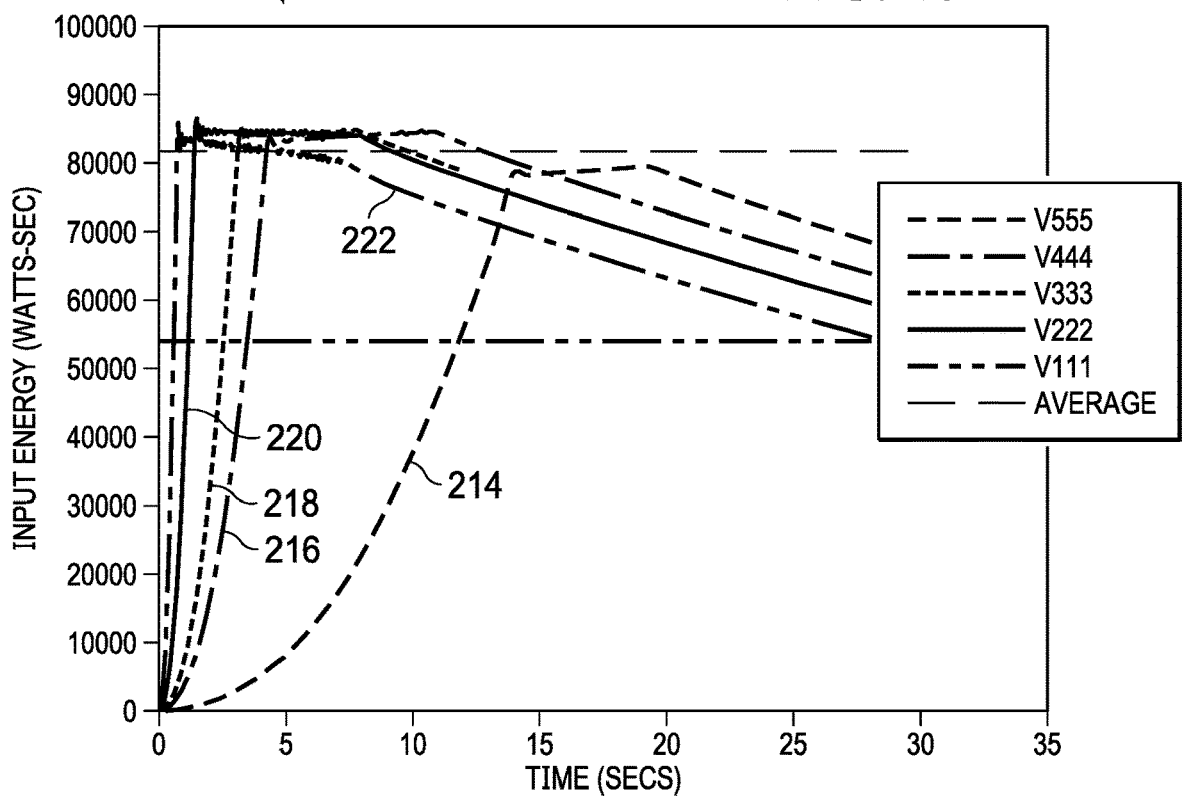
FIG. 16 is a plot of a plurality of curves depicting kinetic energy as a function of time, under condition of the different line-to-line voltages illustrated in FIG. 14.

For each of the test runs, the losses of the electric motor 22 can be calculated for each time interval recorded by the data recorder 26 using the curve 200 illustrated in FIG. 14. For each corresponding time interval on the graph 212, and for each test run, the calculated loss can be subtracted from the respective curves 202, 204, 206, 208, 210 of FIG. 15 to generate respective curves 214, 216, 218, 220, 222 on a graph 224, as illustrated in FIG. 16. The curves 214, 216, 218, 220, 222 represent the rotor kinetic energy of the electric motor 22 for each of the first, second, third, fourth, and fifth test runs, respectively, as a function of time. The graph 224 can be a Cartesian graph having a linear vertical axis (y-axis) and a linear horizontal axis (x-axis). The rotor kinetic energy can be plotted on the linear vertical axis and time can be plotted on the linear horizontal axis.

By calculating the losses for the electric motor 22 on an interval-by-interval basis, the particular loss at any given point in time during the testing of the electric motor 22 can be identified. As such, the calculation of kinetic energy (or any calculation involving losses) can be more detailed and precise then conventional calculation methods.

Figure 17:
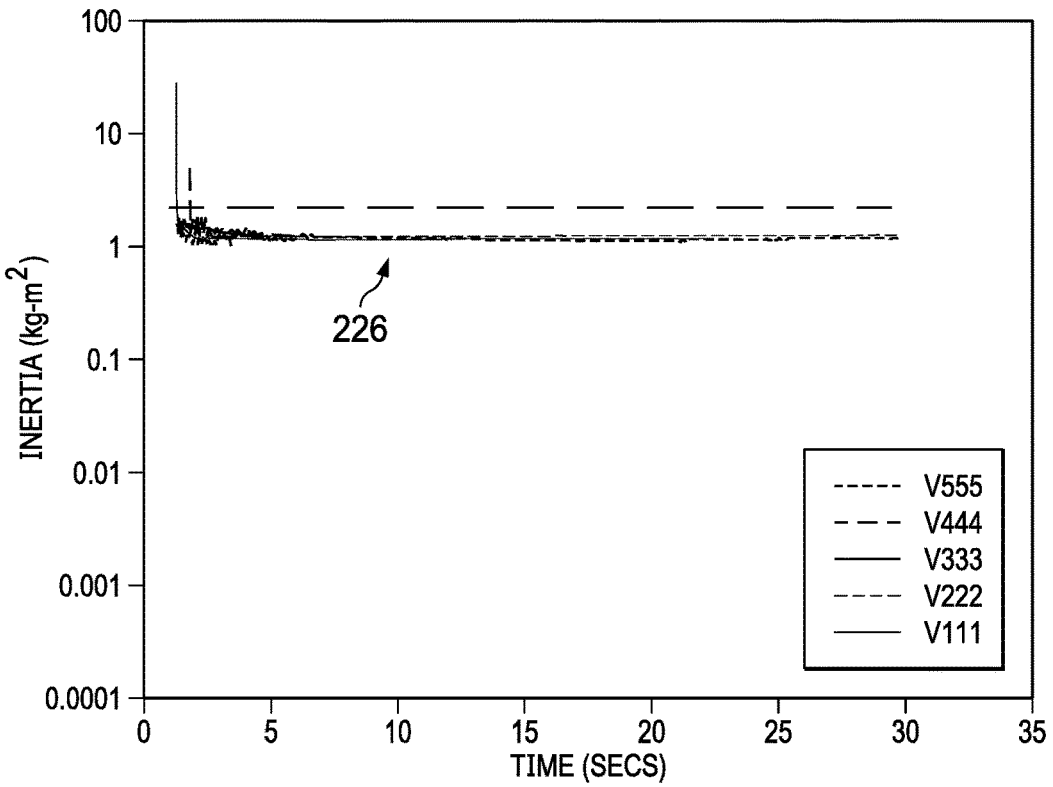
FIG. 17 is a plot of a plurality of curves depicting inertia as a function of time, under condition of the different line-to-line voltages illustrated in FIG. 14.

Referring now to FIG. 17, respective curves (226, generally) of an inertia of the electric motor 22 for each test run can be generated on a graph 228 from the curves 214, 216, 218, 220, 222 illustrated in FIG. 16. In particular, for each corresponding time interval on the graph 224, a speed of the electric motor can be identified and the equation $(2*KE)/w^2$ (where KE=kinetic energy and w=speed) can be applied at each corresponding time interval of the curves to calculate the inertia for each time interval. The inertia for each test run is then plotted relative to time to generate the curves 226 illustrated in FIG. 17. The graph 228 can be a Cartesian graph having a logarithmic vertical axis (y-axis) and a linear horizontal axis (x-axis). The inertia can be plotted on the logarithmic vertical axis and time can be plotted on the linear horizontal axis.

The curves 226, 228, 230, 232, 234 illustrated in FIG. 17 can provide an indication of whether the electric motor 22 has passed or failed the no-load rotor test. For example, if the curves 226, 228, 230, 232, 234 are substantially colinear (e.g., the values and slopes of each curve are substantially aligned with the values and slopes of the other curves), as illustrated in FIG. 17, the electric motor 22 can be considered to have passed the no-load test. However, if at least one of the curves 226, 228, 230, 232, 234 diverges from the rest of the curves 226, 228, 230, 232, 234 (e.g., at least one slope a curve is not substantially aligned with the corresponding slope of the other curves), the electric motor 22 can be considered to have failed the no-load test (e.g., due to a problem with the electric motor 22 and/or a problem with the nature of the testing or calculations). In other words, since the inertia of the motor does not change between test runs, calculations from a test at any voltage should yield the same inertia, within the limits of experimental error.

In one embodiment, the curves 226, 228, 230, 232, 234 illustrated in FIG. 17 can be presented to a user on a monitor and/or in printed form so that a user can visually inspect the results to compare the curves 226, 228, 230, 232, 234 to determine whether the electric motor 22 has passed or failed the no-load test. In another embodiment, the curves 226, 228, 230, 232, 234 illustrated in FIG. 7 can be analyzed by the computing system to determine whether the electric motor 22 has passed or failed the no-load test.

The method of performing the no-load test described above with respect to FIGS. 14-17 can correlate the curves 226, 228, 230, 232, 234 of the no-load test together to provide an easy to read graphical representation of whether the electric motor 22 has passed or failed the no-load test, understanding that the data are physically consistent. As such, the method can provide convenient, traceable and reproducible metrics and cross checks as evidence of credibility and correctness, including allowance for and correction of effects external to the motor that may be unavoidably introduced by the facility's power system used to operate the electric motor 22.

The testing methods disclosed herein can provide a manageable, maintainable system including hardware (FIG. 1), software, and a repeatable process, for assuring reliable and credible results without a dynamometer. The production of the performance curves, data and parameters described herein can provide a more effective method of verifying the operating parameters of the electric motor 22 than can be achieved from conventional arrangements (e.g., information published in manufacturer-published motor nameplates, catalogs and datasheets describing specific motor characteristics, that provide proof of OEM or repaired motor performance, such as: (i) speed, current, voltage, frequency, power, torque, and efficiency at typical operating points, and (ii) segregation of losses). It is to be appreciated that performing the testing method disclosed herein with no-load (e.g., only uncoupled starts), there is no need to wait long intervals between starts even for large motors, as is commonly believed throughout industry. In fact it can be easily demonstrated using the results from FIG. 15, that a negligible amount of energy has been injected into the electric motor 22 during an uncoupled start, thus resulting in minimal temperature rise in the windings. Thus, the temperature rise due to energy loss during an uncoupled starting event can be negligible and thus not as burdensome on the electric motor 22.

It is to be appreciated that any of the testing methods described herein can be conducted individually or in conjunction with one or more of the other testing methods. When the testing methods are conducted in conjunction with the other testing methods, the test runs described above might only need to be conducted once to obtain the necessary raw data for the multiple testing methods being performed.

The testing methods described herein can be used as to provide various data quality metrics for the electric motor 22, such as, for example, calculation of normalized speed-vs-time curves that overlay regardless of line voltage and start time; calculation of normalized voltage vs time curves near a power off event that overlay regardless of line voltage; calculation of stator winding impedance as a cross check on the winding resistance measurement; calculation of actual motor impedance vs speed curves that illustrate the extent of non-linearities in the motor; calculation of normalized (line current/input power) vs speed curves that overlay regardless of line voltage; calculation of normalized (acceleration torque/input power) vs speed curves that overlay regardless of line voltage; calculation of a metric derived from the ratio of (current unbalance/voltage unbalance) that illustrates the separation of facility-power-induced effects such as source impedance and unbalance and voltage unbalance from motor-circuit induced behavior; identification of equivalent-circuit model parameters observed during power-on transient as a cross check on observed quasi-steady-state locked-rotor behavior; and identification of motor equivalent parameters per the IEEE-112 procedure.

The testing methods described herein can facilitate identification and characterization of non-linearities in the 'linear' equivalent circuit model that appear in IEEE, IEC and other standards, including resistance and inductance variation with voltage. This can include calculation of supply impedance at supplied line voltage; separation of flux-field-decay-induced voltage from residual-magnetism-induced voltage observed in the measured motor terminal voltage during power off coast down; processing incremental encoder (i.e. tach signal with multiple pulses per revolution) signals without special edge-detection hardware; and assessing induction motor rotor condition via analysis of transient (startup) line current recording without requiring steady-state speed and at least 50% load to detect faults (e.g., broken bars, cracked end rings, large porosities).

The foregoing description of embodiments and examples of the disclosure has been presented for purposes of illustration and description. It is not intended to be exhaustive or to limit the disclosure to the forms described. Numerous modifications are possible in light of the above teachings. Some of those modifications have been discussed and others will be understood by those skilled in the art. The embodiments were chosen and described in order to best illustrate the principles of the disclosure and various embodiments as are suited to the particular use contemplated. The scope of the disclosure is, of course, not limited to the examples or embodiments set forth herein, but can be employed in any number of applications and equivalent devices by those of ordinary skill in the art. Rather it is hereby intended the scope of the invention be defined by the claims appended hereto. Also, for any methods claimed and/or described, regardless of whether the method is described in conjunction with a flow diagram, it should be understood that unless otherwise specified or required by context, any explicit or implicit ordering of steps performed in the execution of a method does not imply that those steps must be performed in the order presented and may be performed in a different order or in parallel.

What is claimed is:

1. A method for conducting a no-load test of a motor, the method comprising:
applying a first line-to-line voltage to the motor to accelerate the motor to a first steady state speed;
operating the motor at the first steady state speed for a first predetermined time period;
removing the first line-to-line voltage from the motor to decelerate the motor from the first steady state speed;
recording, at a plurality of first time intervals, a first parameter of the motor during acceleration of the motor to the first steady state speed, during operation of the motor at the first steady state speed, and during at least a portion of the deceleration of the motor from the first steady state speed;
generating, on a graph, a first curve of the first parameter of the motor as a function of a variable;
applying a second line-to-line voltage to the motor to accelerate the motor to a second steady state speed;
operating the motor at the second steady state speed for a second predetermined time period;
removing the second line-to-line voltage from the motor to decelerate the motor from the second steady state speed;
recording, at a plurality of second time intervals, a second parameter of the motor during acceleration of the motor to the second steady state speed, during operation of the motor at the second steady state speed, and during at least a portion of the deceleration of the motor from the second steady state speed; and
generating, on the graph, a second curve of the second parameter of the motor as a function of the variable.

2. The method of claim 1 wherein the first parameter comprises an instantaneous speed of the motor in response to the first line-to-line voltage, the second parameter comprises an instantaneous speed of the motor in response to the second line-to-line voltage, and the variable comprises time.

3. The method of claim 2 wherein the graph comprises a Cartesian graph having a logarithmic vertical axis and a logarithmic horizontal axis and wherein instantaneous speed is plotted along the logarithmic vertical axis and time is plotted along the logarithmic horizontal axis.

4. The method of claim 3 further comprising:
determining a start time for the first steady state speed; and
determining a start time for the second steady state speed, and wherein generating the second curve comprises generating the second curve such that the start time of the second steady state speed is aligned with the start time of the first steady state speed along a horizontal axis.

5. The method of claim 2 wherein:
the graph comprises a Cartesian graph having a linear vertical axis and a linear horizontal axis; and
after generating each of the first curve and the second curve on the graph, the method further comprises:
determining a start time for the first steady state speed;
determining a start time for the second steady state speed;
rescaling the first curve, the second curve, and the graph into logarithmic scale such that the Cartesian graph has a logarithmic vertical axis and a logarithmic horizontal axis and the first curve and the second curve are depicted logarithmically; and
generating the second curve such that the start time of the second steady state speed is aligned with the start time of the first steady state speed on the logarithmic horizontal axis.

6. The method of claim 1 wherein the first time intervals occur at a sampling rate of between about 50 kHz and 150 kHz.

7. The method of claim 1 wherein the second time intervals occur at a sampling rate of between about 50 kHz and 150 kHz.

8. A method for conducting a no-load, locked rotor test of a motor, the method comprising:
applying a first line-to-line voltage to the motor to accelerate the motor from startup to a first steady state speed;
recording, at a plurality of first time intervals, a first voltage and a first current of the motor from startup to the first steady state speed;
recording, at each of the plurality of first time intervals, a first elapsed time since startup of the motor;
calculating a first acceleration of the motor;
calculating a first power input to the motor at startup from the first voltage and the first current;
for the first line-to-line voltage, at each first time interval, plotting the first power input, the first elapsed time, and the first acceleration on a graph as a function of the first voltage, wherein the graph comprises a Cartesian graph having a logarithmic vertical axis and a logarithmic horizontal axis;
applying a second line-to-line voltage to the motor to accelerate the motor from startup to a second steady state speed;
recording, at a plurality of second time intervals, a second voltage and a second current of the motor from startup to the second steady state speed;
recording, at each of the plurality of second time intervals, a second elapsed time since startup of the motor;
calculating a second acceleration of the motor;
calculating a second power input to the motor at startup from the second voltage and the second current;
for the second line-to-line voltage, at each second time interval, plotting the second power input, the second elapsed time, and the second acceleration on the graph as a function of the second voltage;
applying a third line-to-line voltage to the motor to accelerate the motor from startup to a third steady state speed;
recording, at a plurality of third time intervals, a third voltage and a third current of the motor from startup to the third steady state speed;
recording, at each of the plurality of third time intervals, a third elapsed time since startup of the motor;
calculating a third acceleration of the motor;
calculating a third power input to the motor at startup from the third voltage and the third current;
for the third line-to-line voltage, at each third time interval, plotting the third power input, the third elapsed time, and the third acceleration on the graph as a function of the third voltage;
generating a first continuous curve from the plotting of the first power input, the second power input, and the third power input;
generating a second continuous curve from the plotting of the first elapsed time, the second elapsed time, and the third elapsed time;

generating a third continuous curve from the plotting of the first acceleration, the second acceleration, and the third acceleration;

calculating a slope of each of the first, second, and third continuous curves;

comparing the slopes of each of the first, second, and third continuous curves to determine whether the motor has passed or failed the no-load, locked rotor test.

9. The method of claim 8 wherein the first acceleration comprises an average acceleration from startup to the first steady state speed of the motor, the second acceleration comprises an average acceleration from startup to the second steady state speed of the motor, and the third acceleration comprises an average acceleration from startup to the third steady state speed of the motor.

10. The method of claim 8 wherein each of the first acceleration, the second acceleration, and the third acceleration comprises an instantaneous acceleration at startup of the motor.

11. The method of claim 8 wherein:
generating the first continuous curve comprises curve fitting the plotting of the first power input, the second power input, and the third power input;
generating the second continuous curve comprises curve fitting the plotting of the first elapsed time, the second elapsed time, and the third elapsed time; and
generating the third continuous curve comprises curve fitting the plotting of the first acceleration, the second acceleration, and the third acceleration.

12. The method of claim 8 wherein generating the second continuous curve comprises generating the second continuous curve from an inverse of the first elapsed time, the second elapsed time, and the third elapsed time.

13. The method of claim 8 wherein comparing the slopes of each of the first, second, and third continuous curves comprises identifying whether one of the slopes diverges from another of the slopes to determine whether the motor has passed or failed the no-load, locked rotor test.

14. The method of claim 8 wherein the slope of the second continuous curve is an exponential component of a power function of a behavior of the motor as a function of line voltage.

15. A method for conducting a no-load test of a motor, the method comprising:
applying a first line-to-line voltage to the motor for a first predefined time period;
recording, at a plurality of first time intervals during the first predefined time period, a first voltage and a first current of the motor;
removing the first line-to-line voltage from the motor after the first predefined time period;
calculating, for each first time interval, a first inertia of the motor;
applying a second line-to-line voltage to the motor for a second predefined time period;
recording, at a plurality of second time intervals during the second predefined time period, a second voltage and a second current of the motor;
removing the second line-to-line voltage from the motor after the second predefined time period;
calculating, for each second time interval, a second inertia of the motor;
generating, on a graph, a first plot of the first inertia of the motor as a function of time;
generating, on the graph, a second plot of the second inertia of the motor as a function of time; and
comparing the first plot and the second plot to determine whether the motor has passed or failed the no-load test.

16. The method of claim 15 further comprising:
recording, at each of the plurality of first time intervals, a first angular velocity of the motor;
recording, at each of the plurality of second time intervals, a second angular velocity of the motor;
calculating, for each first time interval, a first kinetic energy;
calculating, for each second time interval, a second kinetic energy; and wherein:
calculating the first inertia of the motor comprises calculating, for each first time interval, the first inertia of the motor from the first angular velocity of the motor and the first kinetic energy; and
calculating the second inertia of the motor comprises calculating, for each second time interval, the second inertia of the motor from the second angular velocity of the motor and the second kinetic energy.

17. The method of claim 16 further comprising:
calculating, for each first time interval, a first input energy from the first voltage and the first current; and
calculating, for each second time interval, a second input energy from the second voltage and the second current;
calculating, for each first time interval, first machine losses of the motor; and
calculating, for each second time interval, second machine losses of the motor; and wherein:
calculating the first kinetic energy of the motor comprises calculating, for each first time interval, the first kinetic energy from the first input energy and the first machine losses; and
calculating the second kinetic energy of the motor comprises calculating, for each second time interval, the second kinetic energy from the second input energy and the second machine losses.

18. The method of claim 17 further comprising:
calculating, for each first time interval, a first input power from the first voltage and the first current; and
calculating, for each second time interval, a second input power from the second voltage and the second current; and wherein:
calculating the first machine losses of the motor comprises calculating, for each first time interval, the first machine losses from the first input power and the first voltage; and
calculating the second machine losses of the motor comprises calculating, for each second time interval, the second machine losses from the second input power and the second voltage.

19. A method for conducting a no-load test of a motor, the method comprising:
applying a first line-to-line voltage to the motor for a first predefined time period;
recording, at a plurality of first time intervals during the first predefined time period, a first voltage and a first current of the motor;
calculating, for each first time interval, first losses of the motor;
applying a second line-to-line voltage to the motor for a second predefined time period;
recording, at a plurality of second time intervals during the second predefined time period, a second voltage and a second current of the motor; and
calculating, for each second time interval, second losses of the motor.

20. The method of claim 19 further comprising:
calculating, for each first time interval, a first input power from the first voltage and the first current; and
calculating, for each second time interval, a second input power from the second voltage and the second current; and wherein:
calculating the first losses of the motor comprises plotting on a graph, for each first time interval, the first input power as a function of the first voltage; and
calculating the second losses of the motor comprises plotting on the graph, for each second time interval, the second input power as a function of the second voltage.

* * * * *